United States Patent
Kim et al.

(10) Patent No.: US 12,249,605 B2
(45) Date of Patent: Mar. 11, 2025

(54) TERNARY INVERTER AND METHOD OF MANUFACTURING THE SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Jae Won Jeong, Ulsan (KR); Youngeun Choi, Ulsan (KR); Wooseok Kim, Ulsan (KR)

(73) Assignee: UNIST(ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 354 days.

(21) Appl. No.: 17/673,754

(22) Filed: Feb. 16, 2022

(65) Prior Publication Data

US 2023/0005909 A1    Jan. 5, 2023

(30) Foreign Application Priority Data

Jun. 30, 2021    (KR) .......................... 10-2021-0085671

(51) Int. Cl.
*H01L 27/092*    (2006.01)
*H01L 21/02*    (2006.01)
(Continued)

(52) U.S. Cl.
CPC ...... *H01L 27/0922* (2013.01); *H01L 21/0259* (2013.01); *H01L 21/823807* (2013.01);
(Continued)

(58) Field of Classification Search
CPC ..... H01L 21/823807; H01L 21/823814; H01L 21/8221; H01L 21/823828;
(Continued)

(56) References Cited

U.S. PATENT DOCUMENTS 4,107,549 A * 8/1978 Moufah ........... H03K 19/09425
326/59
5,563,530 A * 10/1996 Frazier .................... H03M 5/20
326/132
(Continued)

FOREIGN PATENT DOCUMENTS

JP        S61-145932 A      7/1986
KR     20060110702 A     10/2006
(Continued)

OTHER PUBLICATIONS

Beneventi, G. et al., "Dual-Metal-Gate InAs Tunnel FET With Enhanced Turn-On Steepness and High On-Current," *IEEE Transactions On Electron Devices*, 61(3):776-784 (Mar. 2014).
(Continued)

*Primary Examiner* — Sitaramarao S Yechuri
(74) *Attorney, Agent, or Firm* — Klarquist Sparkman, LLP

(57) ABSTRACT

Provided are an inverter including a first source and drain, an interlayer insulating film on the first source, a second source on the interlayer insulating film, a second drain on the first drain, a first channel between the first source and drain, a second channel over the first channel between the second source and drain, a gate insulating film covering outer surfaces of the first and second channel, a part of a surface of the first source in the direction to the first drain, a part of a surface of the second source in the direction to the second drain, a part of a surface of the first drain in the direction to the first source, and a part of a surface of the second drain in the direction to the second source, and a gate electrode between the first source and drain and between the second source and drain.

11 Claims, 23 Drawing Sheets

(51) Int. Cl.
  *H01L 21/8238* (2006.01)
  *H01L 29/06* (2006.01)
  *H01L 29/423* (2006.01)
  *H01L 29/66* (2006.01)
  *H01L 29/786* (2006.01)

(52) U.S. Cl.
  CPC .. *H01L 21/823814* (2013.01); *H01L 29/0665* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
  CPC ......... H01L 21/823857; H01L 21/0259; H01L 29/0665; H01L 29/42392; H01L 29/66545; H01L 29/0673; H01L 29/7391; H01L 29/0847; H01L 29/66742; H01L 29/78618; H01L 29/78696; H01L 29/42312; H01L 27/0688; H01L 27/0727; H01L 27/092; H01L 27/0922; B82Y 10/00; H03K 19/09425
  See application file for complete search history.

(56) References Cited

U.S. PATENT DOCUMENTS

| | | | |
|---|---|---|---|
| 8,890,120 B2 | 11/2014 | Kotlyar et al. | |
| 10,243,040 B1 | 3/2019 | Park et al. | |
| 11,101,374 B1* | 8/2021 | Reznicek | H01L 29/068 |
| 2006/0240622 A1* | 10/2006 | Lee | H01L 29/785 |
| | | | 438/257 |
| 2016/0020305 A1 | 1/2016 | Obradovic et al. | |
| 2017/0133279 A1 | 5/2017 | Peng | |
| 2019/0328277 A1 | 10/2019 | Woo et al. | |
| 2019/0393091 A1 | 12/2019 | Cheng et al. | |
| 2020/0144122 A1 | 5/2020 | Cheng et al. | |
| 2020/0402984 A1 | 12/2020 | Reznicek et al. | |
| 2021/0184000 A1 | 6/2021 | Ramaswamy et al. | |
| 2022/0165731 A1* | 5/2022 | Huang | H01L 21/02603 |

FOREIGN PATENT DOCUMENTS

| | | |
|---|---|---|
| KR | 20170045377 A | 4/2017 |
| KR | 20190043359 A | 4/2019 |
| KR | 10-2021-0061246 | 5/2021 |
| KR | 10-2021-0061252 | 5/2021 |
| KR | 10-2021-0061253 | 5/2021 |

OTHER PUBLICATIONS

Kim, H. et al., "Demonstration of Tunneling Field-Effect Transistor Ternary Inverter," *IEEE Transactions On Electron Devices*, 67(10):4541-4544 (Oct. 2020).

* cited by examiner

TERNARY INVERTER AND METHOD OF MANUFACTURING THE SAME

CROSS-REFERENCE TO RELATED APPLICATION

This application is based on and claims priority under 35 U.S.C. § 119 to Korean Patent Application No. 10-2021-0085671, filed on Jun. 30, 2021, in the Korean Intellectual Property Office, the disclosure of which is incorporated by reference herein in its entirety.

BACKGROUND

1. Field

One or more embodiments relate to a ternary inverter and a method of manufacturing the ternary inverter, and more particularly, to a ternary inverter having a small area and high energy efficiency and a method of manufacturing the ternary inverter.

2. Description of the Related Art

Binary logic-based digital systems in the related art have focused on increasing bit density through miniaturization of complementary metal-oxide semiconductor (CMOS) devices to quickly process large amounts of data. However, as the CMOS devices are recently integrated to 30 nm or less, the increasing of bit density is limited by an increase in leakage current and power consumption due to a quantum tunneling effect. To overcome such a limitation of bit density, the interest in ternary logic devices and circuits, which are one of multi-valued logics, is rapidly increasing. In particular, the development of a standard ternary inverter (STI) as a basic unit for realizing ternary logic has been actively progressing. However, unlike binary inverters using two CMOSs for one voltage source, techniques in the related art that are related to an STI have problems in that more voltage sources are required, or a complex circuit configuration is required or a large area is required.

SUMMARY

One or more embodiments include a ternary inverter having a small area and high energy efficiency and a method of manufacturing the ternary inverter. However, these problems are exemplary, and the scope of the present disclosure is not limited thereto.

Additional aspects will be set forth in part in the description which follows and, in part, will be apparent from the description, or may be learned by practice of the presented embodiments of the disclosure.

According to one or more embodiments, a ternary inverter includes a first source and a first drain apart from each other, an interlayer insulating film on the first source, a second source on the interlayer insulating film and a second drain on the first drain, a first channel positioned between the first source and the first drain and having a $1^{st}$-$1^{st}$ end surface in a direction to the first source and a $1^{st}$-$2^{nd}$ end surface in a direction to the first drain, wherein the $1^{st}$-$1^{st}$ end surface is in contact with the first source, and the $1^{st}$-$2^{nd}$ end surface is in contact with the first drain, a second channel disposed over the first channel to be apart from the first channel, positioned between the second source and the second drain, and having a $2^{nd}$-$1^{st}$ end surface in a direction to the second source and a $2^{nd}$-$2^{nd}$ end surface in a direction to the second drain, wherein the $2^{nd}$-$1^{st}$ end surface is in contact with the second source, and the $2^{nd}$-$2^{nd}$ end surface is in contact with the second drain, a gate insulating film covering an outer surface of the first channel, an outer surface of the second channel, a part of a surface of the first source in the direction to the first drain, the part other than a portion thereof in contact with the first channel, a part of a surface of the second source in the direction to the second drain, the part other than a portion thereof in contact with the second channel, a part of a surface of the first drain in the direction to the first source, the part other than a portion thereof in contact with the first channel, and a part of a surface of the second drain in the direction to the second source, the part other than a portion thereof in contact with the second channel, and a gate electrode between the first source and the first drain and between the second source and the second drain.

The first source may be doped a conductivity type which is different from a conductivity type with which the second source is doped.

The first drain may be doped with with a conductivity type which is different from a conductivity type with which the first source is doped The first drain may be doped with a conductivity type which is different from a conductivity type with which the second drain is doped.

The gate electrode may fill a space between the first channel and the second channel.

The gate electrode may surround a first portion of the gate insulating film, the first portion surrounding the first channel, and a second portion of the gate insulating film, the second portion surrounding the second channel.

The ternary inverter may further include a constant current forming layer, wherein the first source and the first drain may be disposed on the constant current forming layer.

According to one or more embodiments, a method of manufacturing a ternary inverter includes forming a gate structure on a substrate, the gate structure extending in a first direction and including a first sacrificial layer, a first channel on the first sacrificial layer, a second sacrificial layer on the first channel, a second channel on the second sacrificial layer, and a third sacrificial layer on the second channel, forming a dummy gate extending in a second direction intersecting the first direction such that the dummy gate crosses the gate structure, forming a first source in contact with a $1^{st}$-$1^{st}$ end surface of the first channel on one side of the dummy gate and forming a first drain in contact with a $1^{st}$-$2^{nd}$ end surface of the first channel on the other side of the dummy gate, forming an interlayer insulating film on the first source, forming a second source in contact with a $2^{nd}$-$1^{st}$ surface of the second channel on the interlayer insulating film and forming a second drain in contact with a $2^{nd}$-$2^{nd}$ end surface of the second channel on the first drain, removing the dummy gate, removing the first sacrificial layer, the second sacrificial layer, and the third sacrificial layer, forming a gate insulating film covering an outer surface of the first channel, an outer surface of the second channel, a part of a surface of the first source in a direction to the first drain, the part other than a portion thereof in contact with the first channel, a part of a surface of the second source in a direction to the second drain, the part other than a portion thereof in contact with the second channel, a part of a surface of the first drain in a direction to the first source, the part other than a portion thereof in contact with the first channel, and a part of a surface of the second drain in a direction to the second source, the part other than a portion thereof in contact with the second channel, and forming a gate electrode between the first source and the first drain and between the second source and the second drain.

The method may further include doping the first source and the first drain with different conductivity types.

The method may further include doping the second source with a conductivity type different from that of the first source, and doping the second drain with a conductivity type different from that of the first drain.

The forming of the gate electrode may include forming the gate electrode to fill a space where the dummy gate is removed between the first source and the first drain and between the second source and the second drain.

The forming of the gate electrode may include forming the gate electrode to surround a first portion of the gate insulating film, the first portion surrounding the first channel, and a second portion of the gate insulating film, the portion surrounding the second channel.

Other aspects, features, and advantages other than those described above will become apparent from the following detailed description, claims and drawings for implementing the present disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
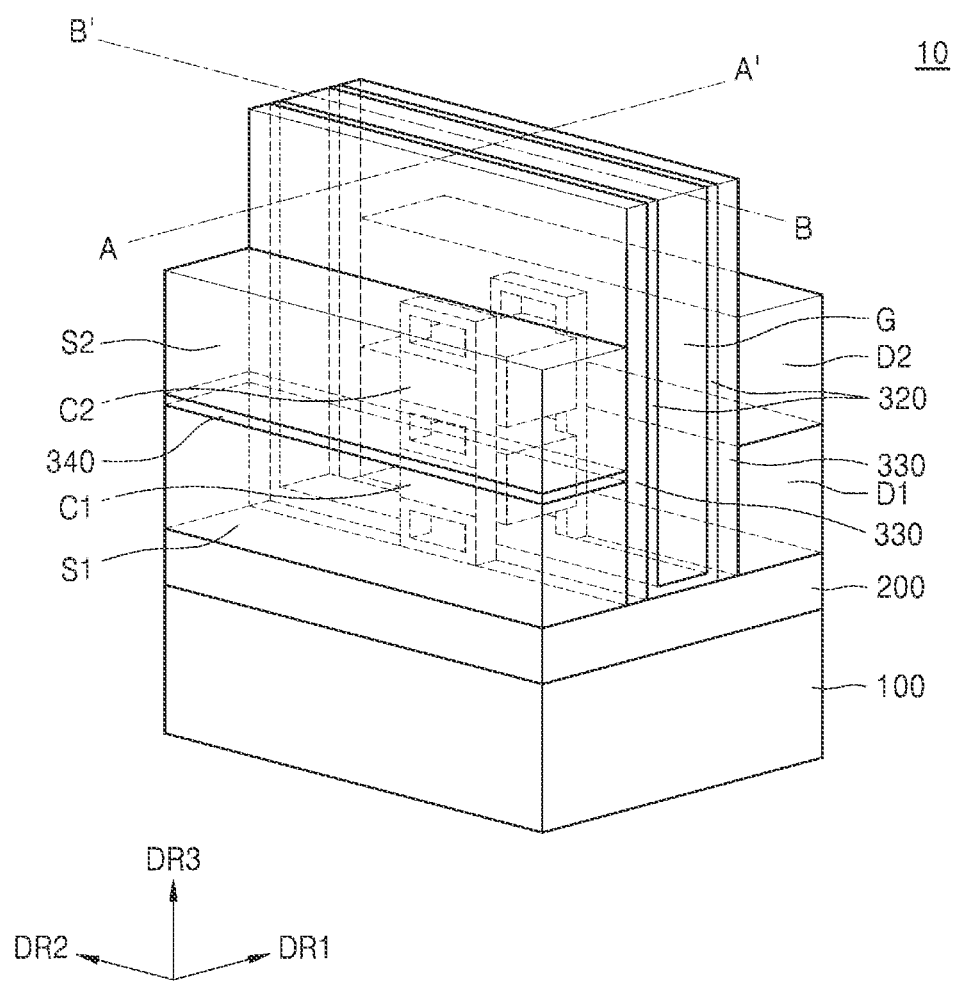
FIG. 1 is a perspective view schematically illustrating a ternary inverter according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. Effects and features of the present disclosure, and a method of achieving them will become apparent with reference to the embodiments described below in detail in conjunction with the drawings. The present disclosure may, however, be embodied in many different forms and should not be construed as being limited to the exemplary embodiments set forth herein.

Hereinafter, the present disclosure will be described in detail by explaining preferred embodiments of the present disclosure with reference to the attached drawings. Like reference numerals in the drawings denote like elements, and redundant descriptions thereof are omitted.

In the following embodiments, it will be understood that when a component, such as a layer, a film, a region, or a plate, is referred to as being "on" another component, the component may be directly on the other component or intervening components may be present therebetween. In addition, sizes of components in the drawings may be exaggerated or reduced for convenience of explanation. In other words, since sizes and thicknesses of components in the drawings are arbitrarily illustrated for convenience of explanation, the following embodiments are not limited thereto.

In the following embodiments, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
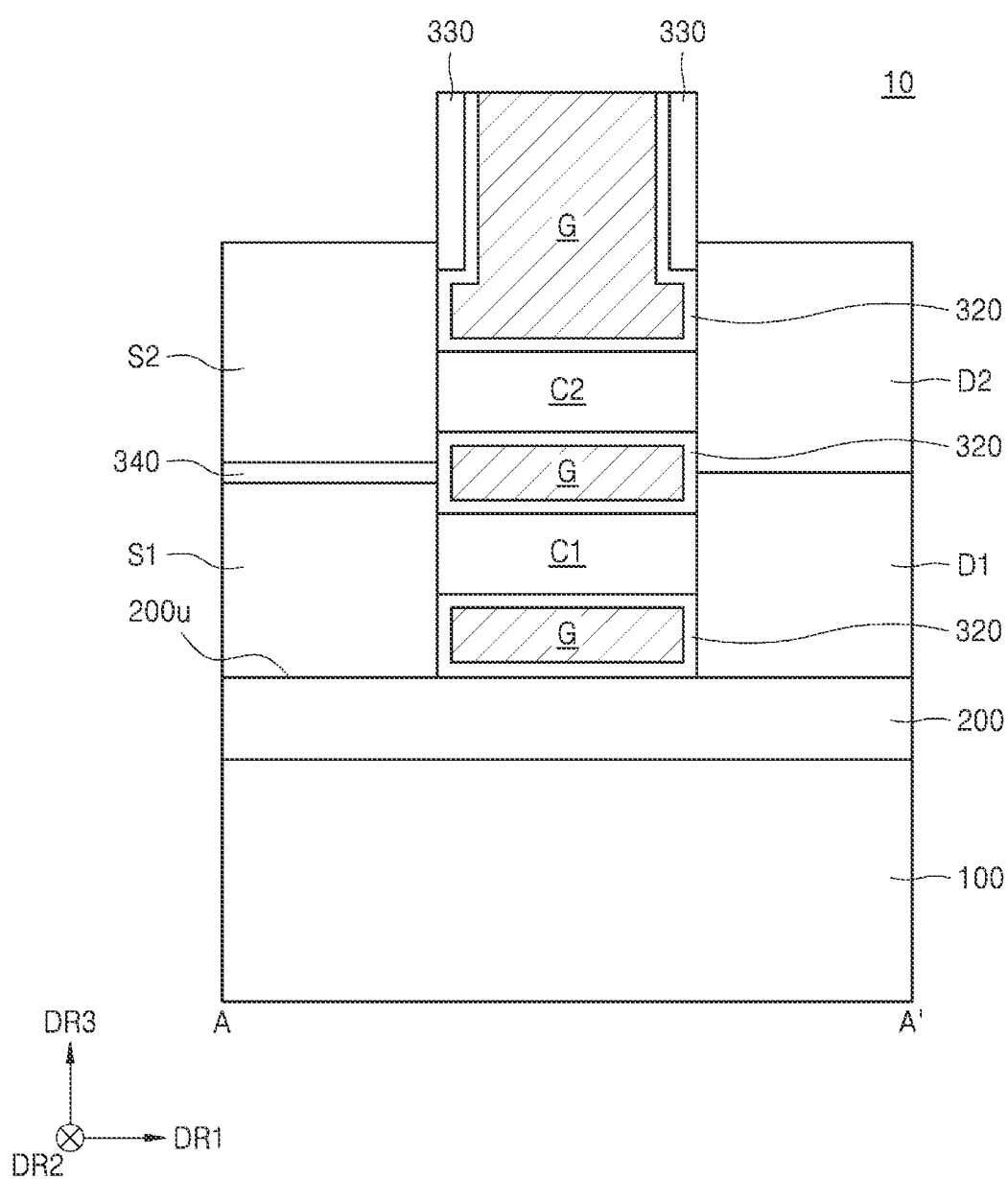
FIG. 2 is a schematic cross-sectional view of the ternary inverter of FIG. 1 taken along line A-A' of FIG. 1.
Figure 3:
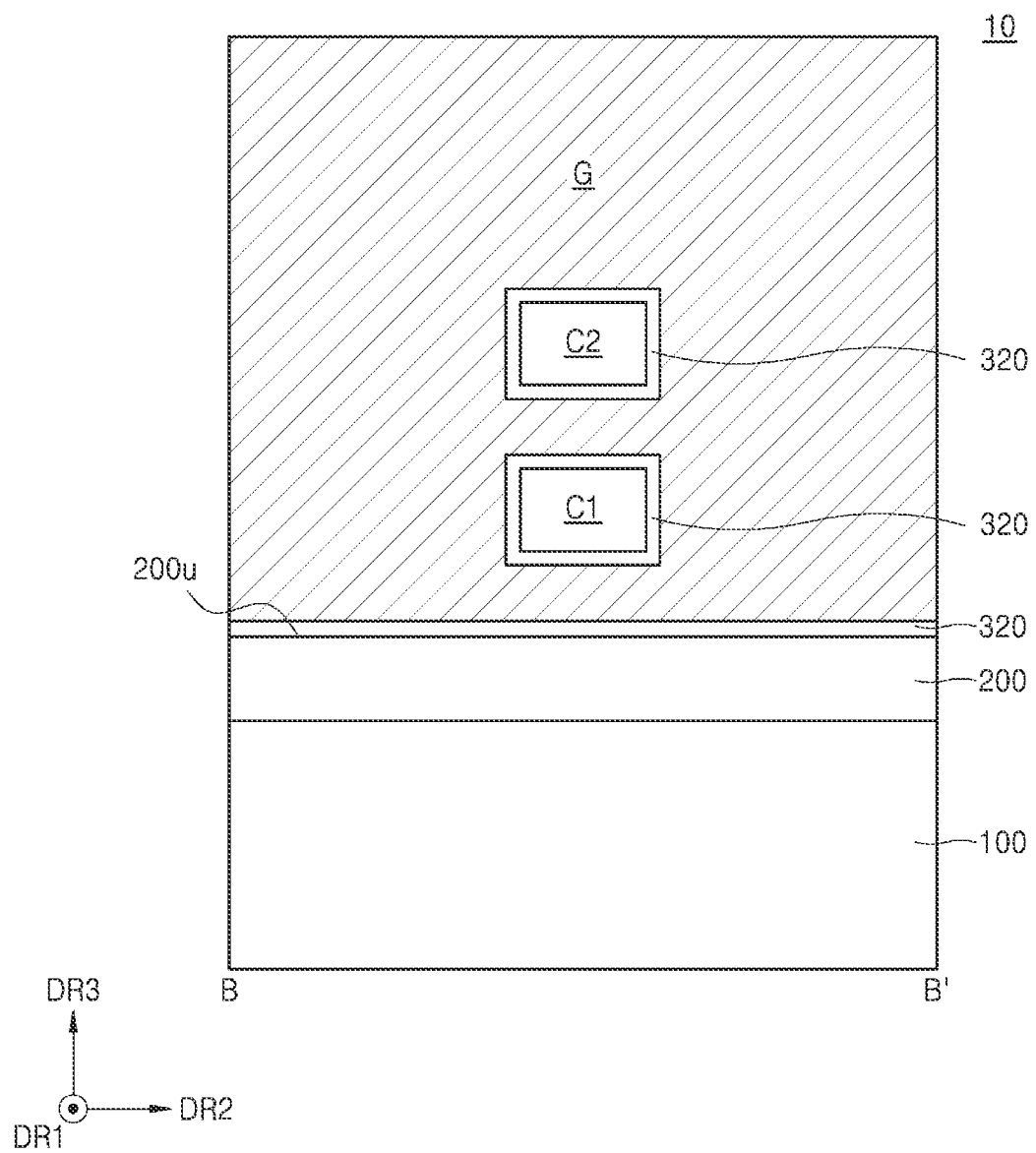
FIG. 3 is a schematic cross-sectional view of the ternary inverter of FIG. 1 taken along line B-B' of FIG. 1.

FIG. 1 is a perspective view schematically illustrating a ternary inverter 10 according to an embodiment, FIG. 2 is a schematic cross-sectional view of the ternary inverter 10 of FIG. 1 taken along line A-A' of FIG. 1, and FIG. 3 is a schematic cross-sectional view of the ternary inverter 10 of FIG. 1 taken along line B-B' of FIG. 1.

The ternary inverter 10 according to the present embodiment may be formed on a substrate 100. The substrate 100 may be a semiconductor substrate. For example, the substrate 100 may include silicon (Si), germanium (Ge), silicon-germanium (SiGe), indium gallium arsenide (InGaAs), or indium arsenide (InAs). However, the present disclosure is not limited thereto, and the substrate 100 may include various other semiconductor materials. The substrate 100 may have a first conductivity type. The first conductivity type may be an n-type or a p-type. When the conductivity type of the substrate 100 is n-type, the substrate 100 may include a Group V element (e.g., phosphorus (P) or arsenic (As)) as an impurity. When the conductivity type of the substrate 100 is p-type, the substrate 100 may include a Group III element (e.g., boron (B) or indium (In)) as an impurity.

When necessary, a constant current forming layer 200 may be formed on the substrate 100. The constant current forming layer 200 may be an epitaxial layer formed in an epitaxial growth operation. The constant current forming layer 200 may include S1. The constant current forming layer 200 may have the first conductivity type. Men the conductivity type of the constant current forming layer 200 is n-type, the constant current forming layer 200 may include a Group V element (e.g., P or As) as an impurity. When the conductivity type of the constant current forming layer 200 is p-type, the constant current forming layer 200 may include a Group III element (e.g., B or In) as an impurity. A doping concentration of the constant current forming layer 200 may be greater than a doping concentration of the substrate 100. For example, the doping concentration of the constant current forming layer 200 may be $3 \times 10^{18}$ cm$^{-3}$ or more.

A first source S1 and a first drain D1 may be spaced apart from each other on the constant current forming layer 200. FIG. 1 illustrates that the first source S1 and the first drain D1 are spaced apart from each other in a first direction DR1 parallel to an upper surface of the substrate 100. The first source S1 and the first drain D1 may each include a doped semiconductor material. For example, the first source S1 and the first drain D1 may each include doped-polysilicon. The first source S1 and the first drain D1 may each be an epitaxial layer.

The first source S1 and the first drain D1 may be doped with different conductivity types to have different conductivity types. That is, the first source S1 may be doped with a conductivity type which is different form a conductivity with which the first drain D1 may be doped. For example, the first source S1 may have the first conductivity type, and the first drain D1 may have a second conductivity type. When the first conductivity type is p-type, the second conductivity type is n-type. For example, the first source S1 may include a Group III element (e.g., B or In) as an impurity, and the first drain D1 may include a Group V element (e.g., P or As) as an impurity.

The first source S1, the first drain D1, and the constant current forming layer 200 may be electrically connected to one another. For example, each of the first source S1 and the first drain D1 may directly contact the constant current forming layer 200. An electric field may be formed between the constant current forming layer 200 and each of the first source S1 and the first drain D1. An intensity of the electric field may be, for example, $10^6$ V/cm or more.

The constant current forming layer 200 may generate a constant current between the substrate 100 and any one of the first source S1 and the first drain D1. The constant current may be a band-to-band tunneling (BTBT) current flowing between the first drain D1 and the substrate 100. The constant current may be independent from a gate voltage applied to a gate electrode G. That is, the constant current may flow regardless of the gate voltage. Because the first source S1 is p-type and the first drain D1 is n-type, when the first source S1, the first drain D1, and the gate electrode G form an N-channel metal-oxide-semiconductor (NMOS) transistor, the constant current may flow from the first drain D1 to the substrate 100 via the constant current forming layer 200. When the first source S1, the first drain D1, and the gate electrode G form a P-channel metal-oxide-semiconductor (PMOS) transistor, the constant current may flow from the substrate 100 to the first drain D1 via the constant current forming layer 200.

An interlayer insulating film 340 may be on the first source S1. The interlayer insulating film 340 may include various insulating materials, for example, silicon oxide, silicon nitride, or silicon oxynitride, or may include a metal oxide such as aluminum oxide. The interlayer insulating film 340 may have a single-layered structure or a multi-layered structure.

A second source S2 may be on the interlayer insulating film 340, and a second drain D2 may be on the first drain D1. The second source S2 and the second drain D2 may be spaced apart from each other.

The second source S2 and the second drain D2 may be doped with different conductivity types to have different conductivity types. In addition, the second source S2 may be doped with a conductivity type different from that of the first source S1 to have a different conductivity type from that of the first source S1. The second drain D2 may be doped with a conductivity type different from that of the first drain D1 to have a different conductivity type from that of the first drain D1. For example, the second source S2 may have the second conductivity type, and the second drain D2 may have the first conductivity type. When the first conductivity type is p-type, the second conductivity type is n-type. For example, the second source S2 may include a Group V element (e.g., P or As) as an impurity, and the second drain D2 may include a Group III element (e.g., B or In) as an impurity.

As described above, the constant current forming layer 200 may be formed on the substrate 100. In this case, an additional constant current forming layer of a different conductivity type from that of the constant current forming layer 200 may be formed on the second drain D2.

The gate electrode G may be on the constant current forming layer 200. The gate electrode G may extend in a second direction DR2 parallel to an upper surface 200u of the constant current forming layer 200. In addition, the gate electrode G may extend in a third direction DR3 perpendicular to the upper surface 200u of the constant current forming layer 200. The gate electrode G may be between the first source S1 and the first drain D1 and between the second source S2 and the second drain D2. At this time, the gate electrode G may be spaced apart from the first source S1, the second source S2, the first drain D1, and the second drain D2 in the first direction DR1. The gate electrode G may include an electrically conductive material. For example, the gate electrode G may include a doped semiconductor material, a metal, an alloy, or a combination thereof. For example, the gate electrode G may include doped-polysilicon, tungsten (W), titanium nitride (TiN), or a combination thereof.

To make the gate electrode G to be spaced apart from the first source S1, the second source S2, the first drain D1, and the second drain D2 in the first direction DR1, a gate spacer 330 may be between the gate electrode G and the first source S1 and the second source S2, and the gate spacer 330 may be between the gate electrode G and the first drain D1 and the second drain D2. Such a pair of gate spacers 330 may be respectively on both sides of the gate electrode G in the first direction DR1.

The gate spacer 330 on one side of the gate electrode G in a direction opposite to the first direction DR1 may contact the first source S1 and the second source S2. Also, the gate spacer 330 on the other side of the gate electrode G in the first direction DR1 may contact the first drain D1 and the second drain D2. Each of the pair of gate spacers 330 may extend in the third direction DR3 perpendicular to the upper surface 200u of the constant current forming layer 200. For example, a distance from the upper surface 200u of the constant current forming layer 200 to an upper surface of each of the pair of gate spacers 330 in the third direction DR3 may be equal to a distance from the upper surface 200u of the constant current forming layer 200 to an upper surface of the gate electrode G in the third direction DR3.

The gate spacer 330 may include various insulating materials. The gate spacer 330 may include, for example, silicon oxide, silicon nitride, or silicon oxynitride, or may include a metal oxide such as aluminum oxide.

In some cases, the gate spacer 330 may be omitted.

A first channel C1 may be between the first source S1 and the first drain D1. The first channel C1 may extend in the first direction DR1 and penetrate the gate electrode G. A $1^{st}$-$1^{st}$ end surface of the first channel C1 in a direction to the first source S1 (that is, a negative first direction −DR1) is in contact with the first source S1, and a $1^{st}$-$2^{nd}$ end surface of the first channel C1 in a direction to the first drain D1 (that is, a positive first direction +DR1) is in contact with the first drain D1. FIG. 1 illustrates that one first channel C1 is between the first source S1 and the first drain D1, but the present disclosure is not limited thereto. For example, a plurality of first channels C1 spaced apart from one another in the third direction DR3 perpendicular to the upper surface 200$u$ of the constant current forming layer 200 may be between the first source S1 and the first drain D1.

A second channel C2 may be between the second source S2 and the second drain D2. The second channel C2 may extend in the first direction DR1 and penetrate the gate electrode G. A $2^{nd}$-$1^{st}$ end surface of the second channel C2 in a direction to the second source S2 (that is, the negative first direction −DR1) is in contact with the second source S2, and a $2^{nd}$-$2^{nd}$ end surface of the second channel C2 in a direction to the second drain D2 (that is, the positive first direction +DR1) is in contact with the second drain D2. The second channel C2 may be spaced apart from the first channel C1 and disposed over the first channel C1. FIG. 1 illustrates that one second channel C2 is between the second source S2 and the second drain D2, but the present disclosure is not limited thereto. For example, a plurality of second channels C2 spaced apart from one another in the third direction DR3 perpendicular to the upper surface 200$u$ of the constant current forming layer 200 may be between the second source S2 and the second drain D2.

The case in which each of the first channel C1 and the second channel C2 extends in the first direction DR1 and penetrates the gate electrode G may mean that the gate electrode G fills a space between the first channel C1 and the second channel C2. In addition, it may be understood that the gate electrode G surrounds a first portion of a gate insulating film 320 to be described below, the first portion surrounding the first channel C1, and a second portion of the gate insulating film 320, the second portion surrounding the second channel C2.

The first channel C1 and the second channel C2 may each include a semiconductor material. For example, the first channel C1 and the second channel C2 may each include Si. The first channel C1 may have the first conductivity type, and the second channel C2 may have the second conductivity type. For example, the first conductivity type may be p-type, and the second conductivity type may be n-type. In this case, the first channel C1 may include a Group III element (e.g., B or In) as an impurity, and the second channel C2 may include a Group V element (e.g., P or As) as an impurity.

The gate insulating film 320 may be on the surface of the gate electrode G. The gate insulating film 320 may be between the gate electrode G and the first channel C1, between the gate electrode G and the second channel C2, between the gate electrode G and the gate spacer 330 on one side of the gate electrode G, between the gate electrode G and the gate spacer 330 on the other side of the gate electrode G, between the gate electrode G and the first source S1, between the gate electrode G and the second source S2, between the gate electrode G and the first drain D1, between the gate electrode G and the second drain D2, and between the gate electrode G and the constant current forming layer 200.

When there is no gate spacer 330, the gate insulating film 320 may cover an outer surface of the first channel C1, an outer surface of the second channel C2, a part of a surface of the first source S1 in the direction to the first drain D1 (that is, the positive first direction +DR1), the part other than a portion thereof in contact with the first channel C1, a part of a surface of the second source S2 in the direction to the second drain D2 (that is, the positive first direction +DR1), the part other than a portion thereof in contact with the second channel C2, a part of a surface of the first drain D1 in the direction to the first source S1 (that is, the negative first direction −DR1), the part other than a portion thereof in contact with the first channel C1, a part of a surface of the second drain D2 in the direction to the second source S2 (that is, the negative first direction −DR1), the part other than a portion thereof in contact with the second channel C2, and a portion of the upper surface 200$u$ of the constant current forming layer 200, the portion corresponding to the gate electrode G.

As such, the gate insulating film 320 may electrically insulate the gate electrode G from the first channel C1 and the second channel C2 by surrounding the outer surface of the first channel C1 and the outer surface of the second channel C2. Also, the gate insulating film 320 may electrically insulate the gate electrode G from the gate spacers 330, the first source S1, the second source S2, the first drain D1, the second drain D2, and the constant current forming layer 200. To this end, the gate insulating film 320 may include an insulating material. For example, the gate insulating film 320 may include silicon oxide, silicon nitride, silicon oxynitride, or the like.

The gate insulating film 320 may also include an insulating material having a high-k dielectric constant. For example, the gate insulating film 320 may include a material having a dielectric constant of about 10 to about 25. For example, the gate insulating film 320 may include at least one material selected from hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

In the case of the ternary inverter 10 according to the present embodiment, because a tunnel field-effect transistor (TFET) formed by the first source S1, the first drain D1, the first channel C1, and the gate electrode G and a TFET formed by the second source S2, the second drain D2, the second channel C2, and the gate electrode G are vertically arranged, a ternary inverter having a small area and high energy efficiency may be realized. In addition, because the first drain D1 and the second drain D2, which may be referred to as output terminals, directly contact each other, an electrical connection therebetween may be ensured while simplifying a manufacturing process of the ternary inverter. At this time, the TFET formed by the first source S1, the first drain D1, the first channel C1, and the gate electrode G may be an n-type TFET, and the TFET formed by the second source S2, the second drain D2, the second channel C2, and the gate electrode G may be a p-type TFET.

Figure 4:
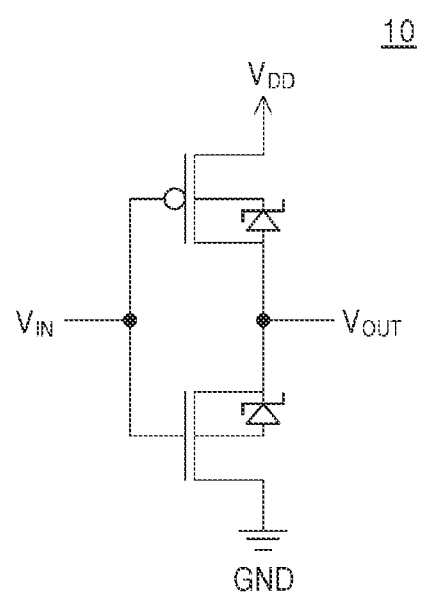
FIG. 4 is an equivalent circuit diagram of the ternary inverter of FIG. 1.

FIG. 4 is an equivalent circuit diagram of the ternary inverter 10 of FIG. 1. As shown in FIG. 4, the ternary inverter 10 according to the present embodiment may include an NMOS transistor (hereinafter referred to as an 'n-type TFET') and a PMOS transistor (hereinafter referred to as a 'p-type TFET'). The n-type TFET may correspond to the first source S1, the first drain D1, the first channel C1, and the gate electrode G, which are described above with reference to FIG. 1, and the p-type TFET may correspond to the second source S2, the second drain D2, the second channel C2, and the gate electrode G, which are described above with reference to FIG. 1.

A ground voltage GND may be applied to a source of the n-type TFET and the substrate 100 of the ternary inverter 10. That is, the ground voltage GND may be applied to the first source S1 of FIG. 1. For brevity of explanation, hereinafter, it is assumed that the ground voltage GND is 0 volt (V). A driving voltage $V_{DD}$ may be applied to a source of the p-type TFET. That is, the driving voltage $V_{DD}$ may be applied to the second source S2 of FIG. 1. An input voltage $V_{IN}$ may be applied to each of the gate electrode G of the n-type TFET and the gate electrode G of the p-type TFET. That is, the input voltage $V_{IN}$ may be applied to the gate electrode G of FIG. 1.

A drain of the n-type TFET may be electrically connected to a drain of the p-type TFET, so the drain of the n-type TFET and the drain of the p-type TFET may have the same voltage. FIG. 1 illustrates that the first drain D1 and the second drain D2, which are vertically stacked, are in contact with each other. In FIG. 1, the voltages of the first drain D1 and the second drain D2 contacting the first drain D1 and disposed on the first drain D1 may be an output voltage $V_{OUT}$ of the ternary inverter 10.

A constant current may flow from the drain of the n-type TFET, that is, the first drain D1, to the substrate 100. The constant current may be independent from the input voltage $V_{IN}$. As described above, when an additional constant current forming layer of a different conductivity type from that of the constant current forming layer 200 is also formed on the second drain D2, a constant current may flow from the drain of the p-type TFET, that is the second drain D2, to the additional constant current forming layer. The constant current may be independent from the input voltage $V_{IN}$.

For example, a first input voltage may be applied to the gate electrode G, so that a channel current of the n-type TFET is dominant over a channel current of the p-type TFET. At this time, the output voltage $V_{OUT}$ of the ternary inverter 10 may be a first voltage.

As another example, a second input voltage may be applied to the gate electrode G, so that the channel current of the p-type TFET is dominant over the channel current of the n-type TFET. At this time, the output voltage $V_{OUT}$ of the ternary inverter 10 may be a second voltage greater than the first voltage.

As another example, a third input voltage may be applied to the gate electrode G, so that the channel current of the n-type TFET is dominant over the channel current of the p-type TFET. At this time, the output voltage $V_{OUT}$ of the ternary inverter 10 may be a third voltage between the first voltage and the second voltage.

A constant current flowing from the drain of the n-type TFET formed by the first source S1, the first drain D1, the first channel C1, and the gate electrode G, that is, the first drain D1, to the substrate 100 may flow regardless of a gate voltage applied to the gate electrode G. A current in the ternary inverter 10 may flow to the substrate 100 via the second drain D2 and the first drain D1. The driving voltage $V_{DD}$ applied to the second source S2 may be distributed to a resistor between the second source S2 and the second drain D2 and a resistor between the first source S1 and the first drain D1. The output voltage $V_{OUT}$ may be a voltage applied to the resistor between the first source S1 and the first drain D1. The output voltage $V_{OUT}$ may have a value between the driving voltage $V_{DD}$ and 0 V.

Depending on the input voltage $V_{IN}$, the output voltage $V_{OUT}$ may have 0 V ('0' state), a voltage ('1' state) between the driving voltage $V_{DD}$ and 0 V, or the driving voltage $V_{DD}$ ('2' state). That is, the ternary inverter 10 according to the present embodiment may have three states depending on the input voltage $V_{IN}$.

Figure 5:
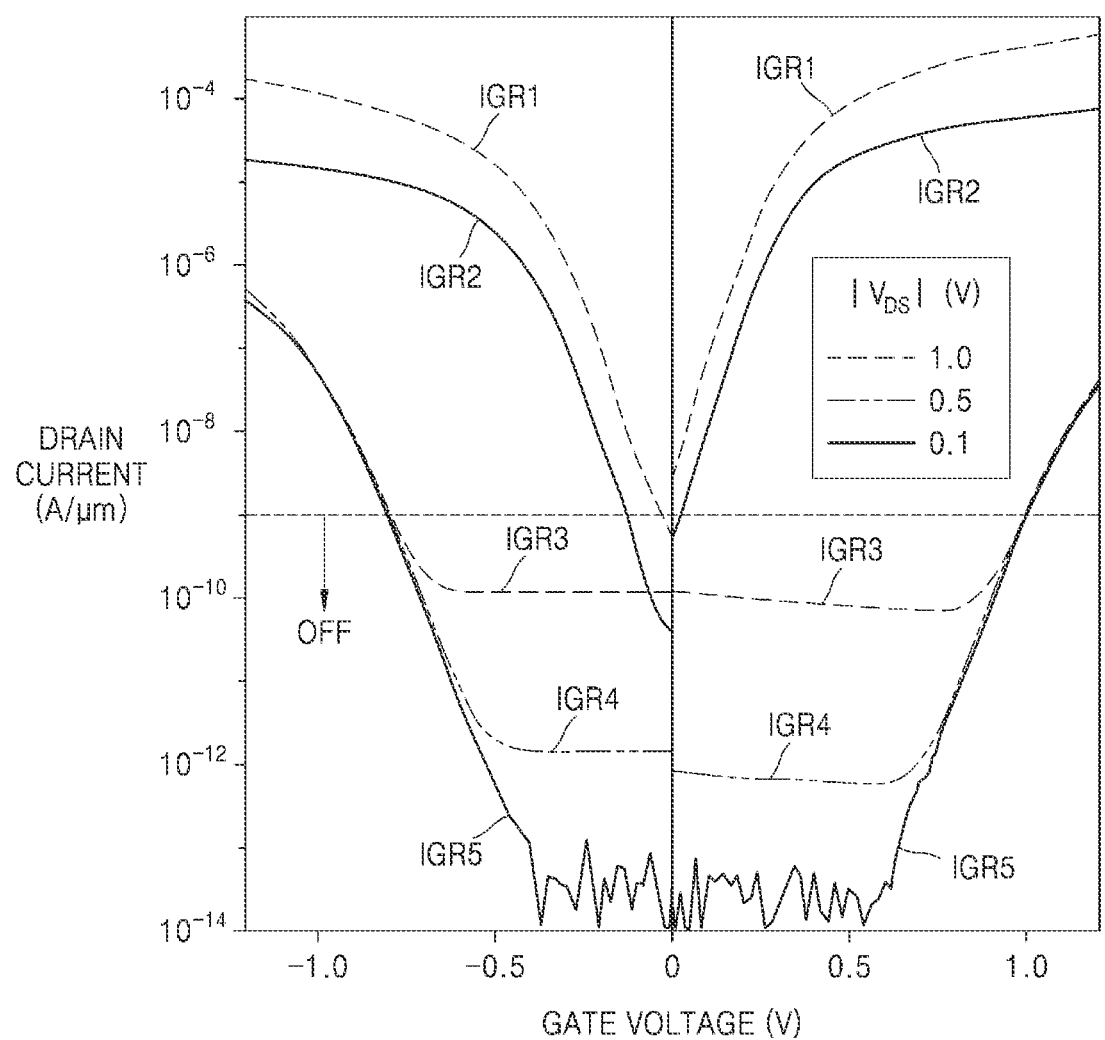
FIG. 5 is a gate voltage-drain current graph of the ternary inverter of FIG. 1 and a binary inverter in the related art.

FIG. 5 is a gate voltage-drain current graph of the ternary inverter 10 of FIG. 1 and a binary inverter in the related art. In particular, FIG. 5 shows gate voltage-drain current graphs IGR1 and IGR2 of a binary inverter and gate voltage-drain current graphs IGR3, IGR4, and IGR5 of the ternary inverter 10 according to the present embodiment. A drain current of the binary inverter did not have a constant current component that flows regardless of a gate voltage. A drain current of the ternary inverter according to the present embodiment has a constant current component that flows regardless of a gate voltage. For example, in the case of the ternary inverter 10 according to the present embodiment, it may be confirmed that a constant current flows even when the ternary inverter 10 is in an off-state.

Figure 6:
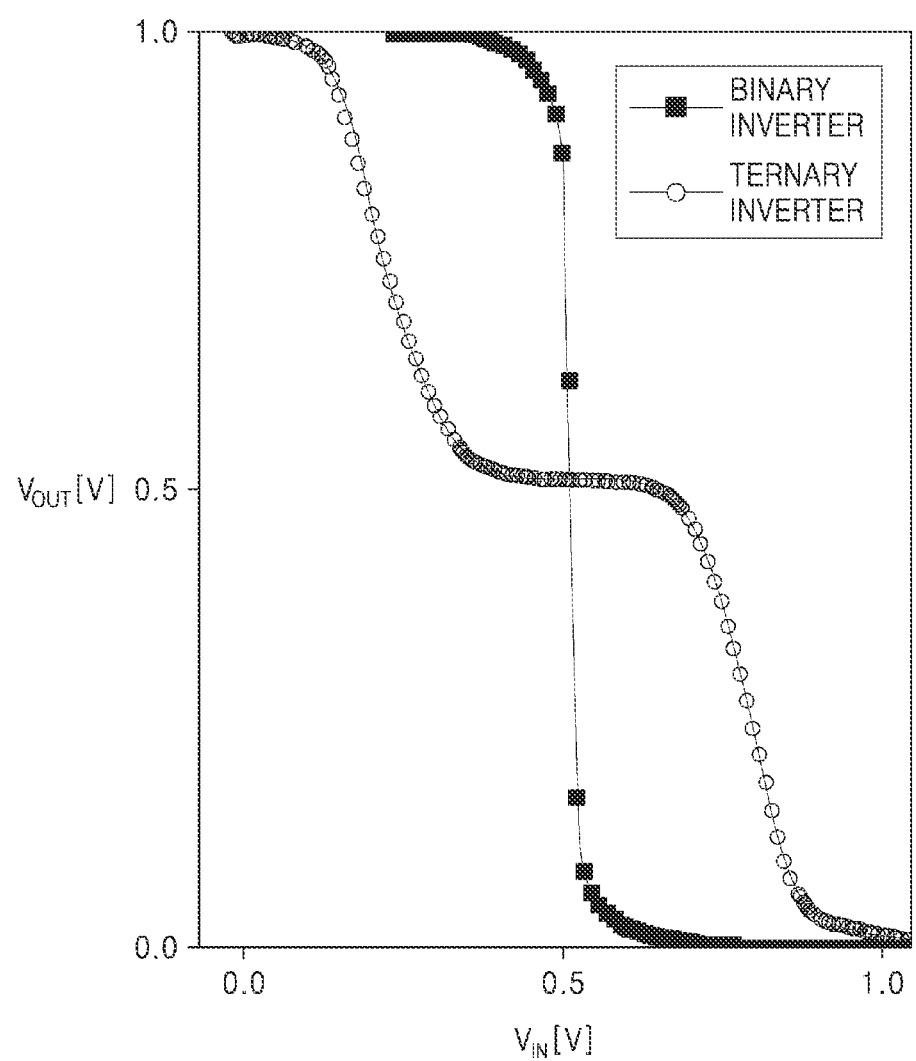
FIG. 6 is an input voltage-output voltage graph of the ternary inverter of FIG. 1 and a binary inverter in the related art.

FIG. 6 is an input voltage $V_{IN}$-output voltage $V_{OUT}$ graph of the ternary inverter 10 of FIG. 1 and a binary inverter in the related art. As can be seen in FIG. 6, the driving voltage $V_{DD}$ of each of the ternary inverter 10 according to the present embodiment and the binary inverter is 1.0 V, and a ground voltage GND is 0 V. The input voltage $V_{IN}$ of each of ternary inverter 10 and the binary inverter is from 0 V to 1.0 V.

In the case of the binary inverter, when the input voltage $V_{IN}$ changes from 0 V to 1 V, the output voltage $V_{OUT}$ thereof rapidly decreases from 1 V to 0 V near the input voltage $V_{IN}$ of 0.5 V. That is, the binary inverter has two states (e.g., a '0' state and a '1' state).

In the ternary inverter 10 according to the present embodiment, when the input voltage $V_{IN}$ changes from 0 V to 1 V, the output voltage $V_{OUT}$ thereof rapidly decreases from 1 V to 0.5 V to maintain at 0.5 V, and then further rapidly decreases from 0.5 V to 0 V. That is, it may be confirmed that the ternary inverter 10 according to the present embodiment has three states (e.g., a '0' state, a '1' state, and a '2' state).

Figure 7:
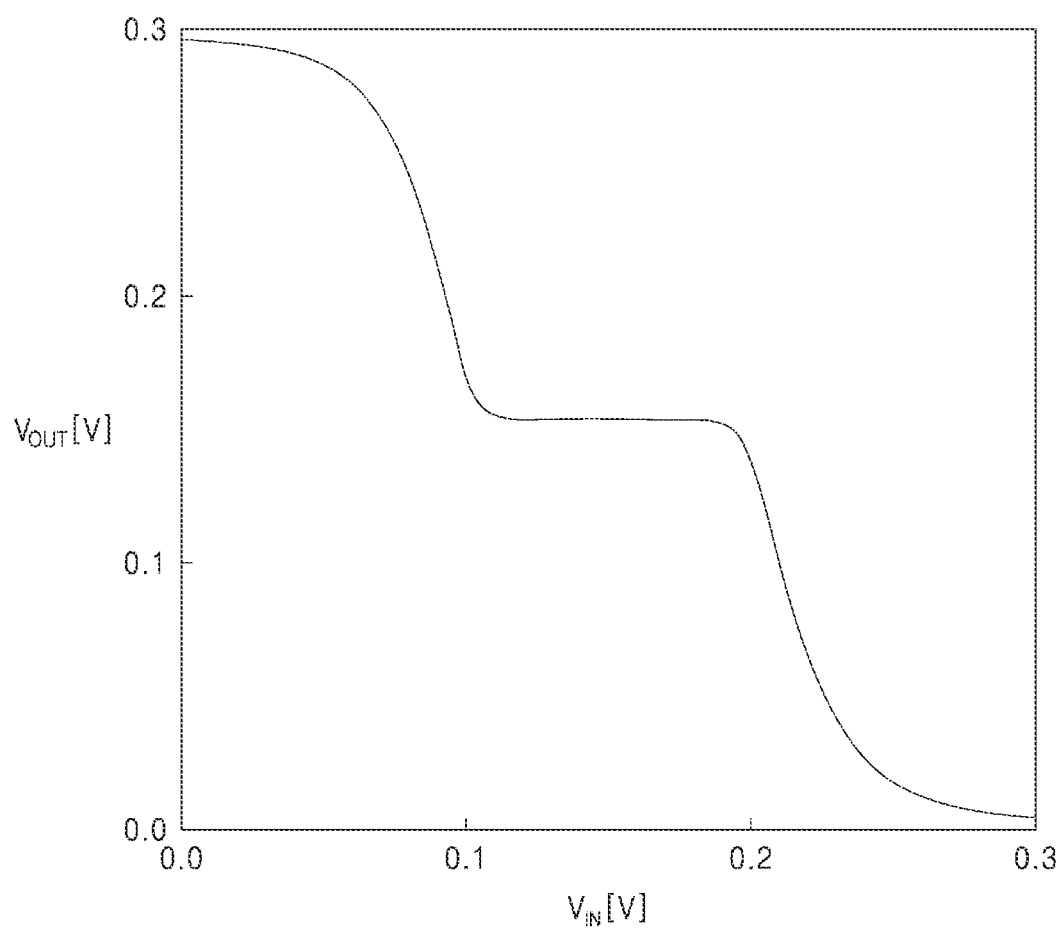
FIG. 7 is a graph showing input/output characteristics of a voltage of a ternary inverter according to an embodiment.

FIG. 7 is a graph showing input/output characteristics of a voltage of a ternary inverter according to an embodiment. Because FIG. 7 is a graph in the same context as that of FIG. 6, descriptions thereof already given with reference to FIG. 6 are omitted, and features are mainly described.

In the ternary inverter according to the present embodiment, when the input voltage $V_{IN}$ changes from 0 V to 0.3 V, the output voltage $V_{OUT}$ thereof rapidly decreases from 0.3 V to 0.15 V to maintain at 0.15 V, and then further rapidly decreases from 0.15 V to 0 V. That is, it may be confirmed that the ternary inverter according to the present embodiment has three states (e.g., a '0' state, a '1' state, and a '2' state). However, a difference from the ternary inverter of an embodiment described with reference to FIG. 6 is that a range of the input voltage and the output voltage is reduced from a range from 0 V to 1V to a range of 0 V to 0.3 V, and accordingly, it may be confirmed that an operating voltage scaling ability of the ternary inverter is improved.

FIGS. 8 to 23 are perspective views and cross-sectional views for explaining a method of manufacturing the ternary inverter 10 of FIG. 1.

Figure 8:
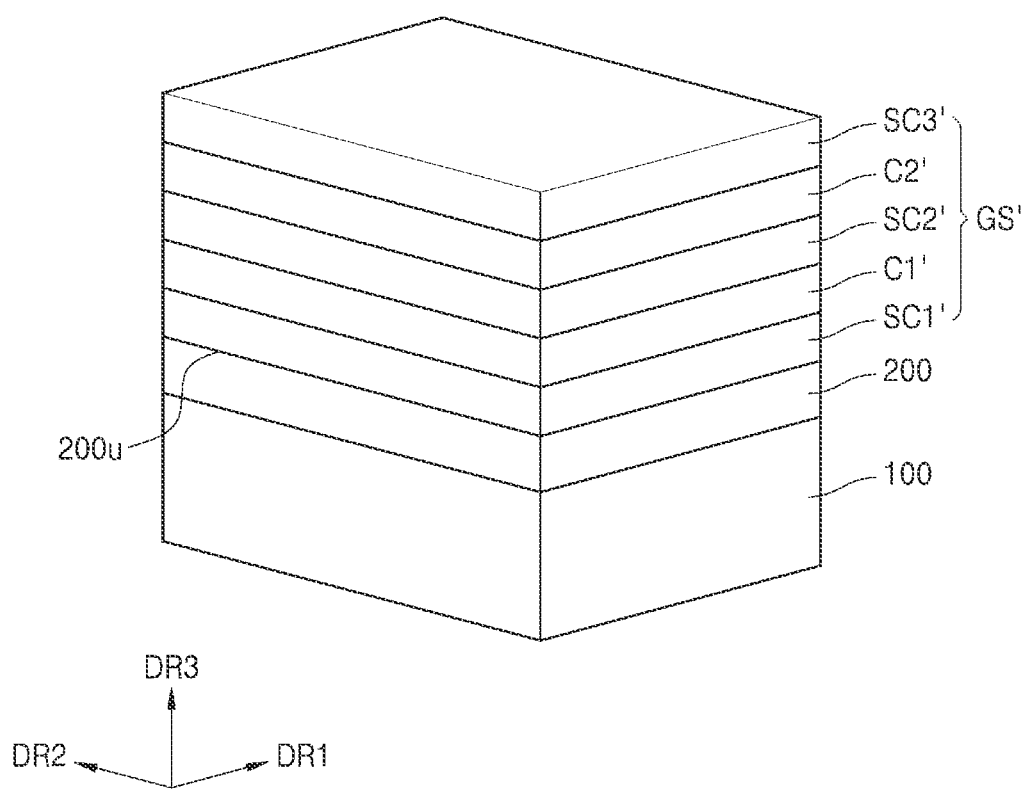
FIGS. 8 to 23 are perspective views and cross-sectional views for explaining a method of manufacturing the ternary inverter of FIG. 1.

First, as shown in FIG. 8, the constant current forming layer 200 may be formed on the substrate 100, and a gate structure GS' may be formed on the constant current forming layer 200. The constant current forming layer 200 may be formed through an epitaxy growth operation. That is, the constant current forming layer 200 may be an epitaxial layer. The constant current forming layer 200 may be a semiconductor layer having a first conductivity type. For example, when the conductivity type of the constant current forming layer 200 is p-type, the constant current forming layer 200 may be a silicon layer including a Group III element (e.g., B or In) as an impurity. When the conductivity type of the constant current forming layer 200 is n-type, the constant current forming layer 200 may be a silicon layer including a Group V element (e.g., P or As) as an impurity. A doping concentration of the constant current forming layer 200 may be greater than a doping concentration of the substrate 100. For example, the doping concentration of the constant current forming layer 200 may be $3 \times 10^{18}$ cm$^3$ or more.

The gate structure GS' may be formed on the constant current forming layer 200. The gate structure GS' may be formed by alternately stacking sacrificial films and channel films. FIG. 8 illustrates that a first sacrificial film SC1' is on the constant current forming layer 200, a first channel layer C1' is on the first sacrificial film SC1', a second sacrificial film SC2' is on the first channel layer C1', a second channel layer C2' is on the second sacrificial film SC2', and a third sacrificial film SC3' is on the second channel layer C2'.

The first to third sacrificial films SC1', SC2', and SC3' and the first and second channel layers C1' and C2' may include materials having different etch selectivities from one another. For example, the first to third sacrificial films SC1', SC2', and SC3' may include SiGe, and the first and second channel layers C1' and C2' may include S1. The gate structure GS' may be formed through a chemical vapor deposition (CVD) operation, a physical vapor deposition (PVD) operation, or an atomic layer deposition (ALD) operation.

Figure 9:
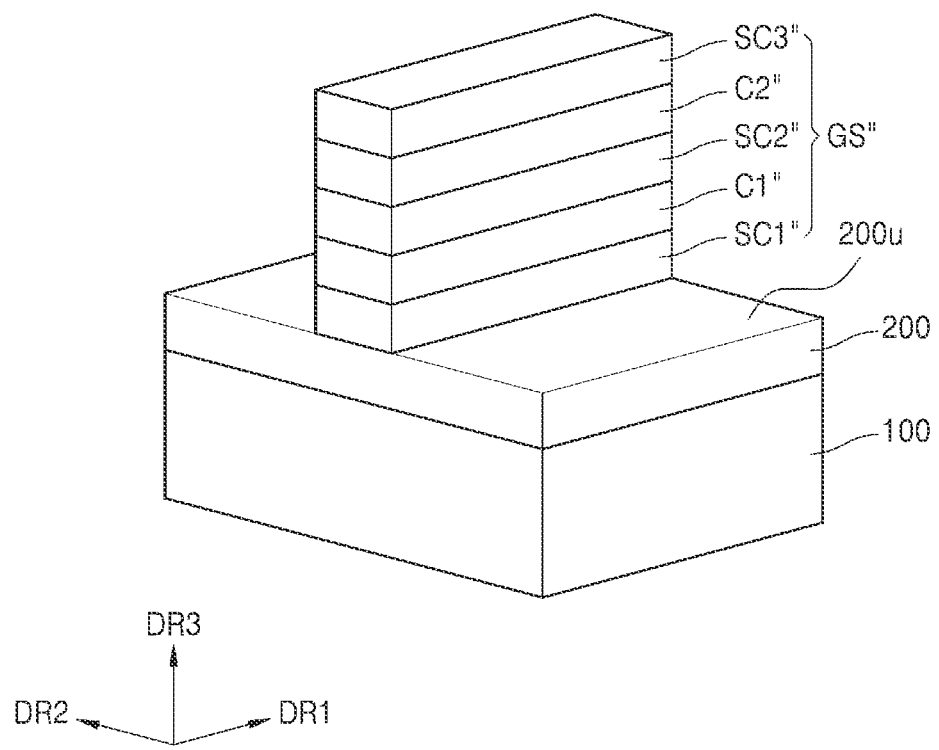

After the gate structure GS' is formed, the gate structure GS' may be patterned as shown in FIG. 9. For example, a portion other than a preset portion of the gate structure GS' of FIG. 8 may be etched by using a mask. When a portion of the gate structure GS' is removed, etching may be performed until the upper surface 200u of the constant current forming layer 200 is exposed in the portion. Accordingly, as shown in FIG. 9, a gate structure GS" may have a shape extending in the first direction DR1. The gate structure GS" may include first to third sacrificial films SC1", SC2", and SC3" and first and second channel layers C1" and C2". The first to third sacrificial films SC1", SC2", and SC3" may be formed by etching the first to third sacrificial films SC1', SC2', and SC3'. The first and second channel layers C1" and C2" may be formed by etching the first and second channel layers C1' and C2'.

Figure 10:
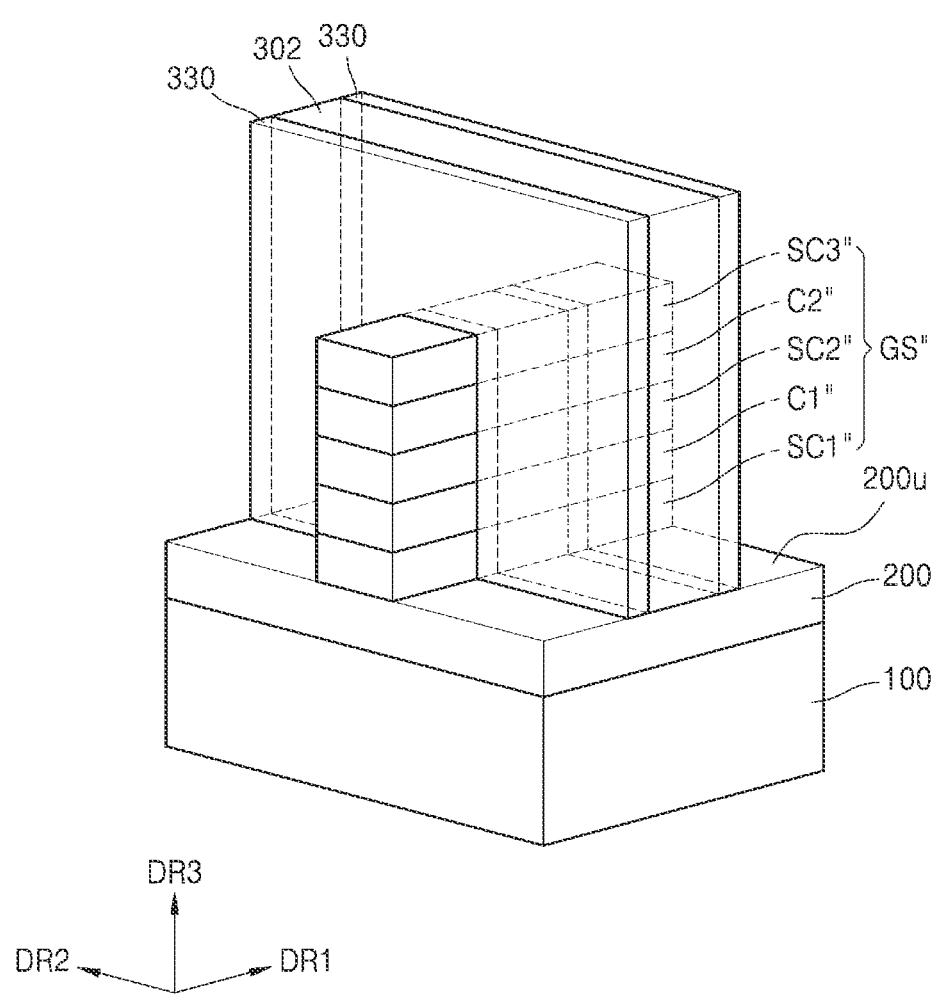

Then, as shown in FIG. 10, a dummy gate 302 and the gate spacers 330 on both sides of the dummy gate 302 may be formed on the constant current forming layer 200. The dummy gate 302 may have a shape extending in the second direction DR2. A portion of the gate structure GS" may be exposed to the outside of the both sides of the dummy gate 302.

The dummy gate 302 may have a high etch selectivity with respect to the gate spacers 330 on the both sides thereof. For example, the dummy gate 302 may include silicon nitride having a high etch selectivity, and the gate spacers 330 may each include silicon oxide having a low etch selectivity.

The dummy gate 302 may be formed by forming a dummy gate film covering the gate structure GS" and patterning the dummy gate film. The patterning of the dummy gate film may be performed until the upper surface 200u of the constant current forming layer 200 is exposed.

The gate spacers 330 on both sides of the dummy gate 302 may cover both side surfaces of the dummy gate 302. A portion of the gate structure GS" may be exposed to the outside of the gate spacers 330.

The gate spacers 330 may be formed by forming a material layer for the gate spacer 330 on the dummy gate 302, the gate structure GS", and the constant current forming layer 200 and etching the material layer. The etching of the material layer for the gate spacer 330 may be performed through an anisotropic dry etching operation.

Figure 11:
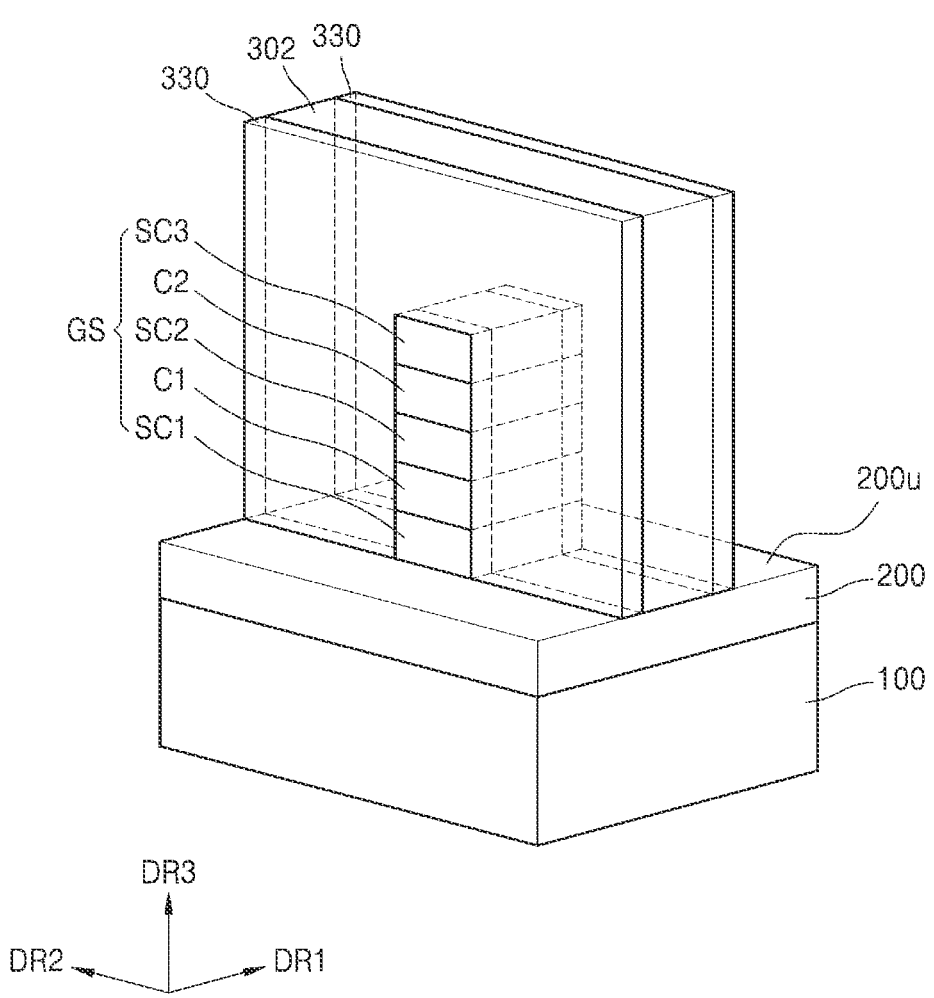

Next, a portion of the gate structure GS" exposed to the outside of the dummy gate 302 and the gate spacers 330 may be removed to form a gate structure GS as shown in FIG. 11. The removing of the gate structure GS" may be performed through an anisotropic etching operation using a mask. Accordingly, the gate structure GS may include a first sacrificial film SC1, the first channel C1 on the first sacrificial film SC1, a second sacrificial film SC2 on the first channel C1, the second channel C2 on the second sacrificial film SC2, and a third sacrificial film SC3 on the second channel C2.

Figure 12:
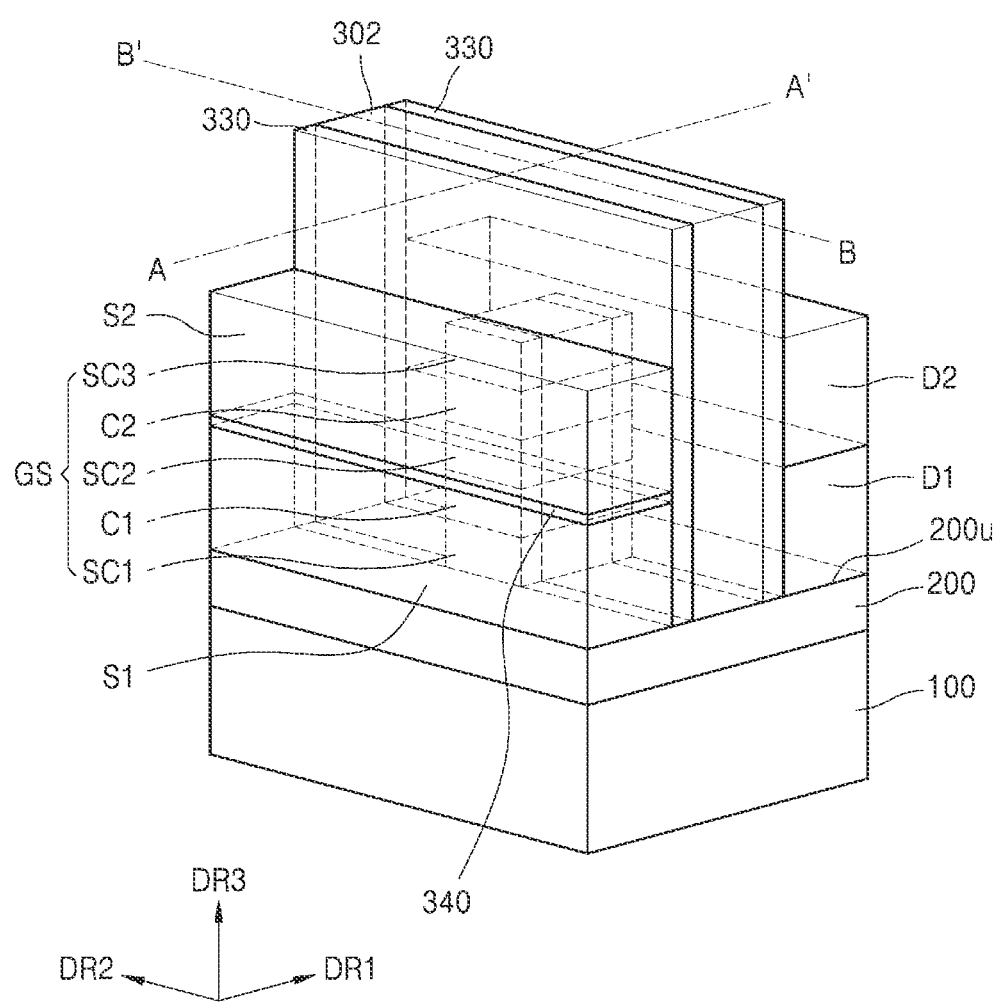
Figure 13:
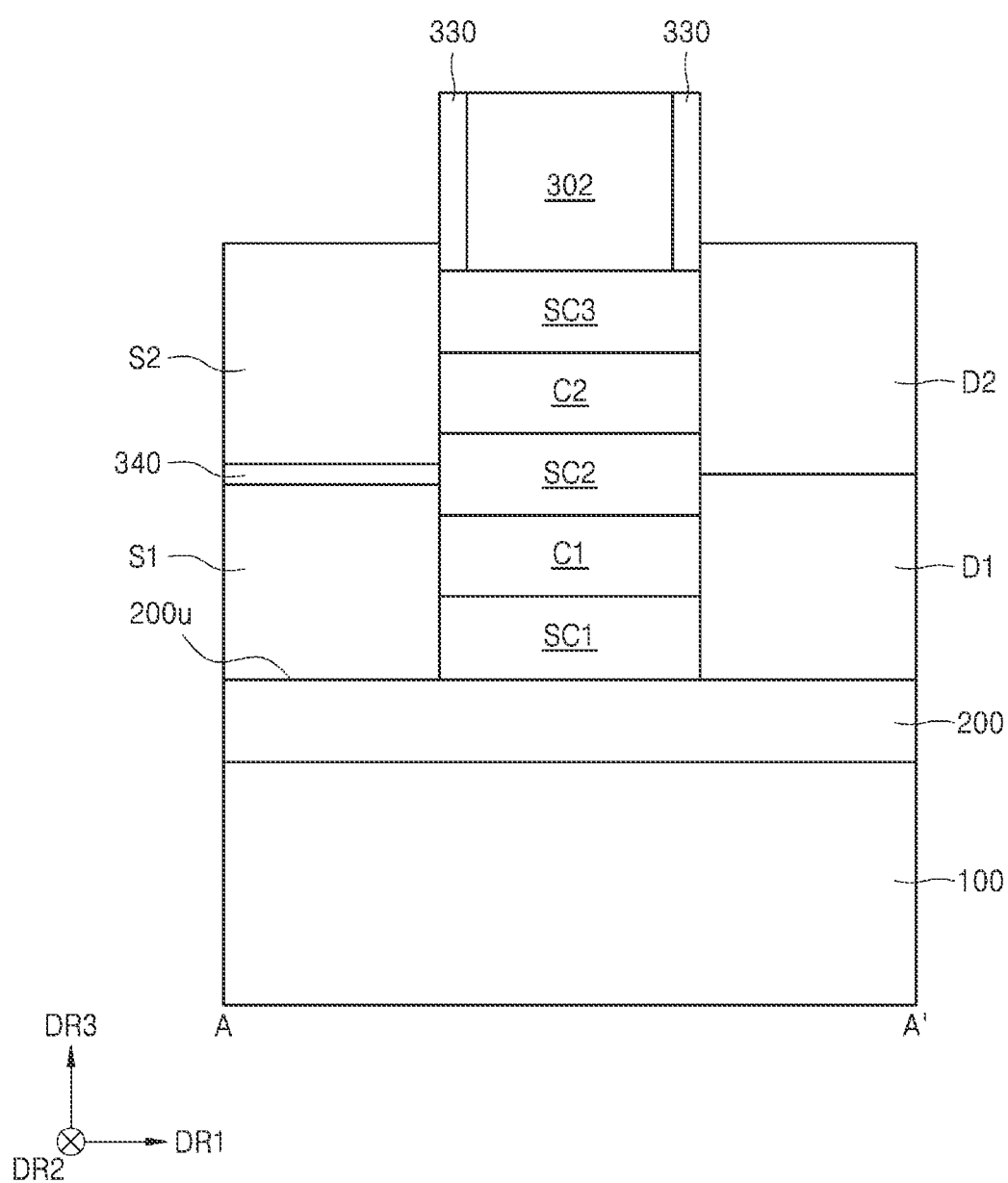
Figure 14:
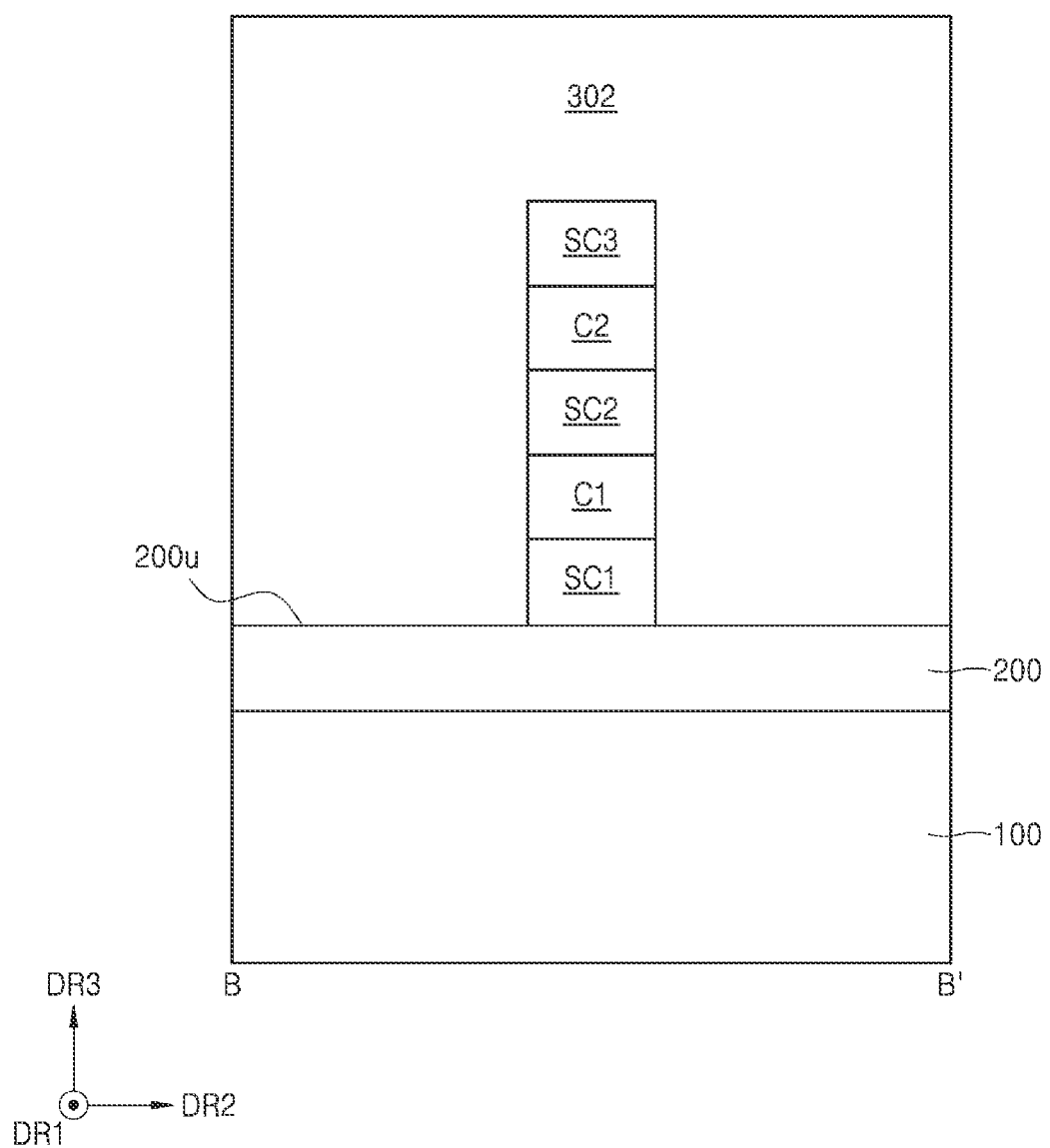

Then, as shown in FIGS. 12 to 14, the first source S1 and the first drain D1 are formed, the interlayer insulating film 340 is formed on the first source S1, the second source S2 is formed on the interlayer insulating film 340, and the second drain D2 is formed on the first drain D1. The first source S1 is formed on one side of the dummy gate 302 in a direction (that is, the negative first direction −DR1) opposite to the first direction DR1, and the first drain D1 is formed on the other side of the dummy gate 302 in the first direction DR1.

The formation of the first source S1 and the first drain D1 may include an epitaxial growth operation. After the first source S1 and the first drain D1 are formed, an operation of doping the first source S1 and the first drain D1 may be performed. For example, the first source S1 may be doped with a Group III element (e.g., B or In) to have a p-type conductivity type, and the first drain D1 may be doped with a Group V element (e.g., P or As) to have an n-type conductivity type.

Similarly, after the second source S2 and the second drain D2 are formed, an operation of doping the second source S2 and the second drain D2 may be performed. For example, the second source S2 may be doped with a Group V element (e.g., P or As) to have an n-type conductivity type, and the second drain D2 may be doped with a Group III element (e.g., B or In) to have a p-type conductivity type.

Figure 15:
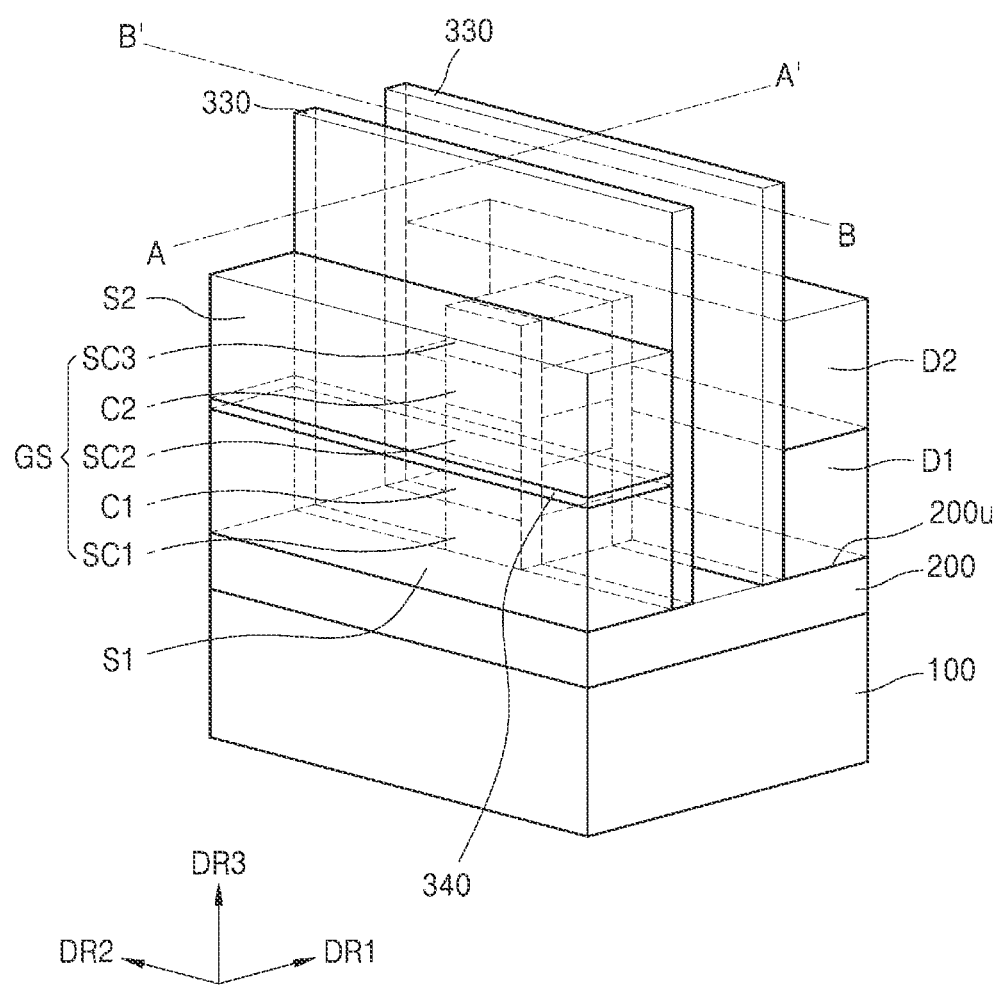
Figure 16:
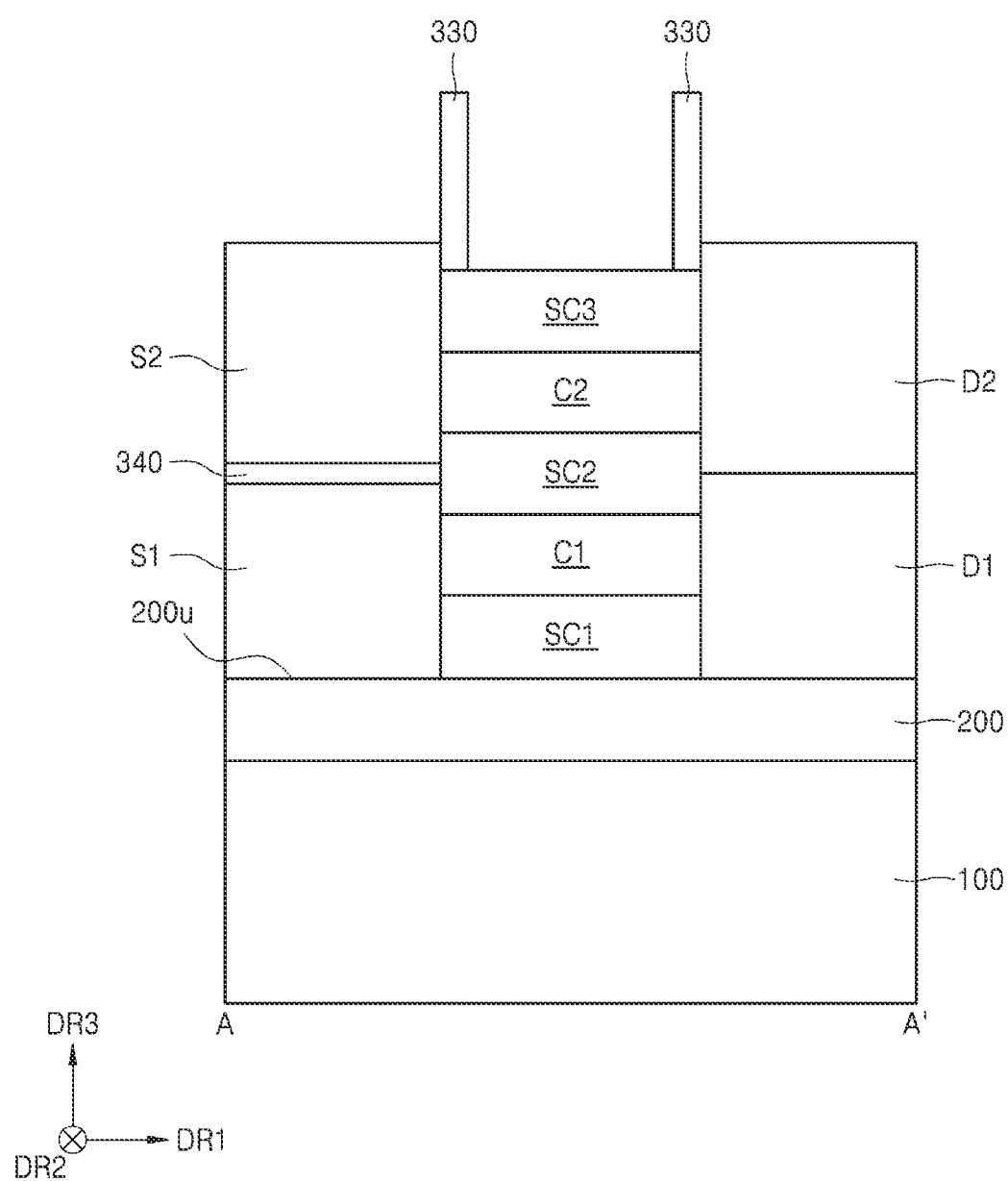
Figure 17:
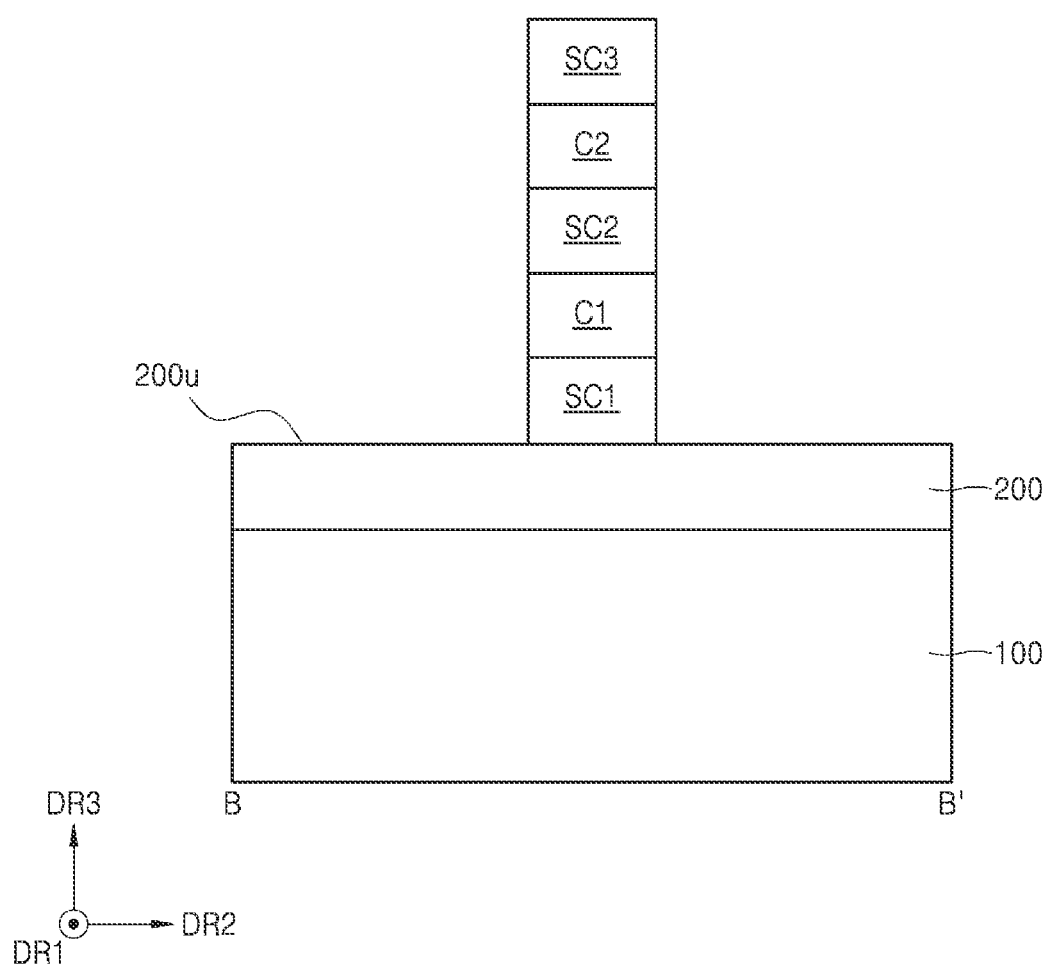

Then, as shown in FIGS. 15 to 17, the dummy gate 302 may be removed. The removing of the dummy gate 302 may be performed through a wet etching operation. At this time, a hydrofluoric acid-based material may be used as an etchant.

Figure 18:
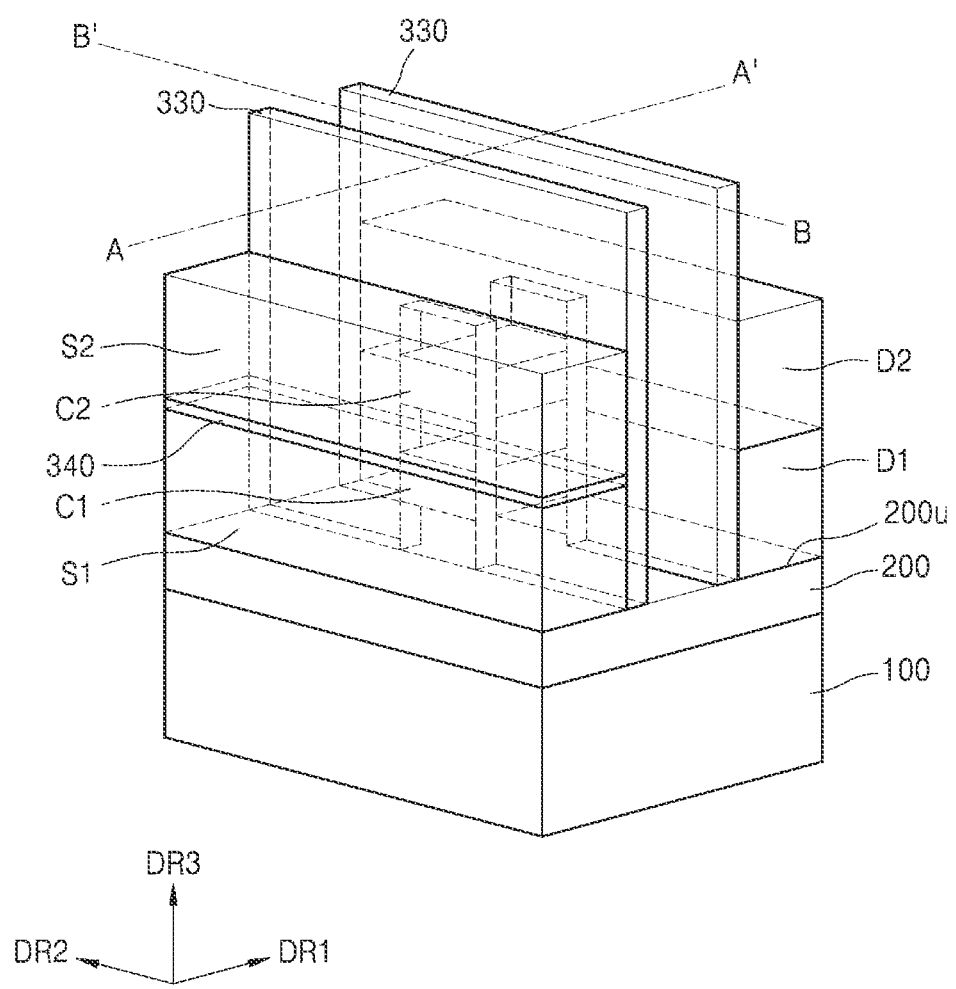
Figure 19:
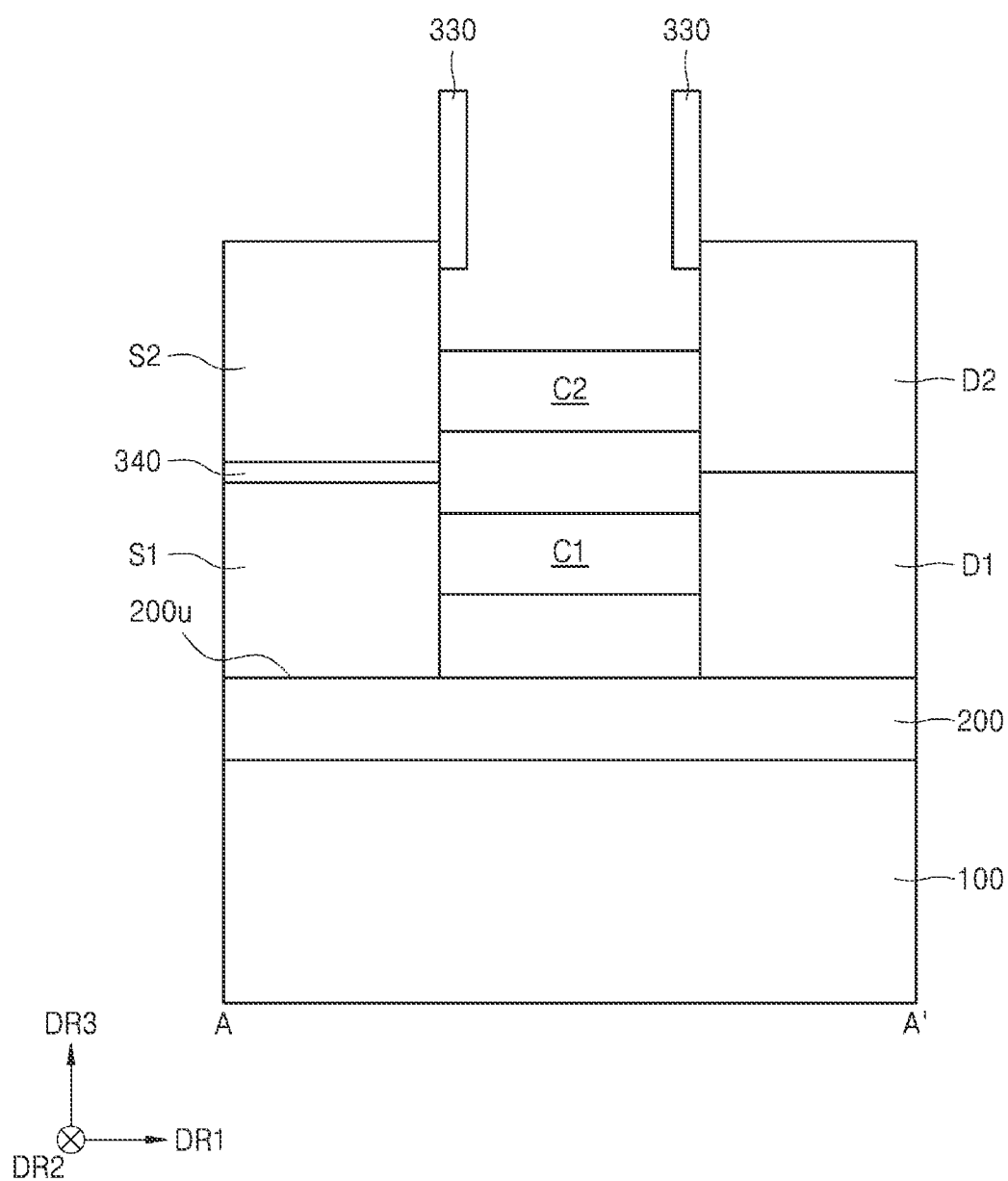
Figure 20:
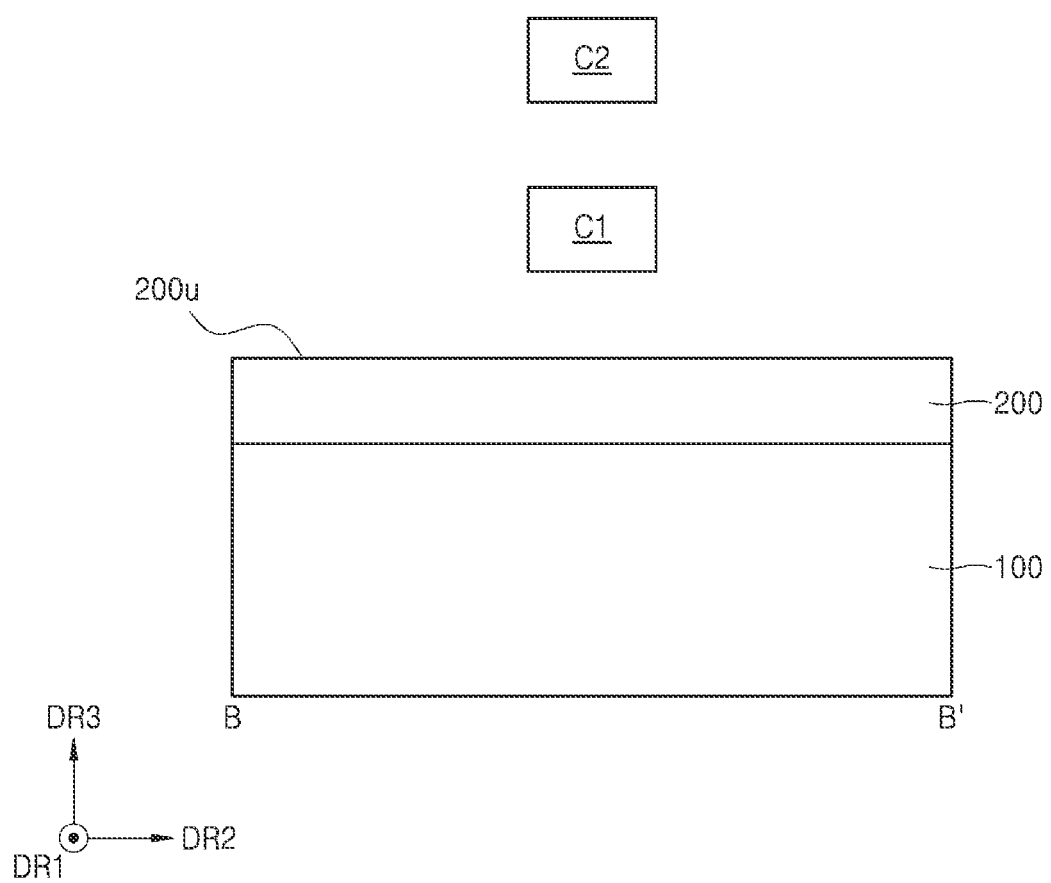

When the dummy gate 302 is removed, a portion of the gate structure GS may be exposed between the gate spacers 330. Accordingly, as shown in FIGS. 18 to 20, the first sacrificial film SC1, the second sacrificial film SC2, and the third sacrificial film SC3 of the gate structure GS are removed. The removing of the first sacrificial film SC1, the second sacrificial film SC2, and the third sacrificial film SC3 may be performed through a chemical dry etching operation or a wet etching operation. For example, the chemical dry etching operation may use plasma generated by a radical generator, and the wet etching operation may use an ammonia-peroxide mixture. In the case of the wet etching operation, in the mixture, $H_2O_2$ may function as an oxidizer, and $NH_4OH$ may function as an oxide etchant.

As the first sacrificial film SC1, the second sacrificial film SC2, and the third sacrificial film SC3 are removed, a part of a surface of the first source S1 in a direction to the first drain D1 (that is, the first direction DR1), a part of a surface of the second source S2 in a direction to the second drain D2 (that is, the first direction DR1), a part of a surface of the first drain D1 in a direction to the first source S1 (that is, the negative first direction −DR1), a part of a surface of the second drain D2 in a direction to the second source S2 (that is, the negative first direction −DR1), an outer surface of the first channel C1, and an outer surface of the second channel C2 may be exposed.

Figure 21:
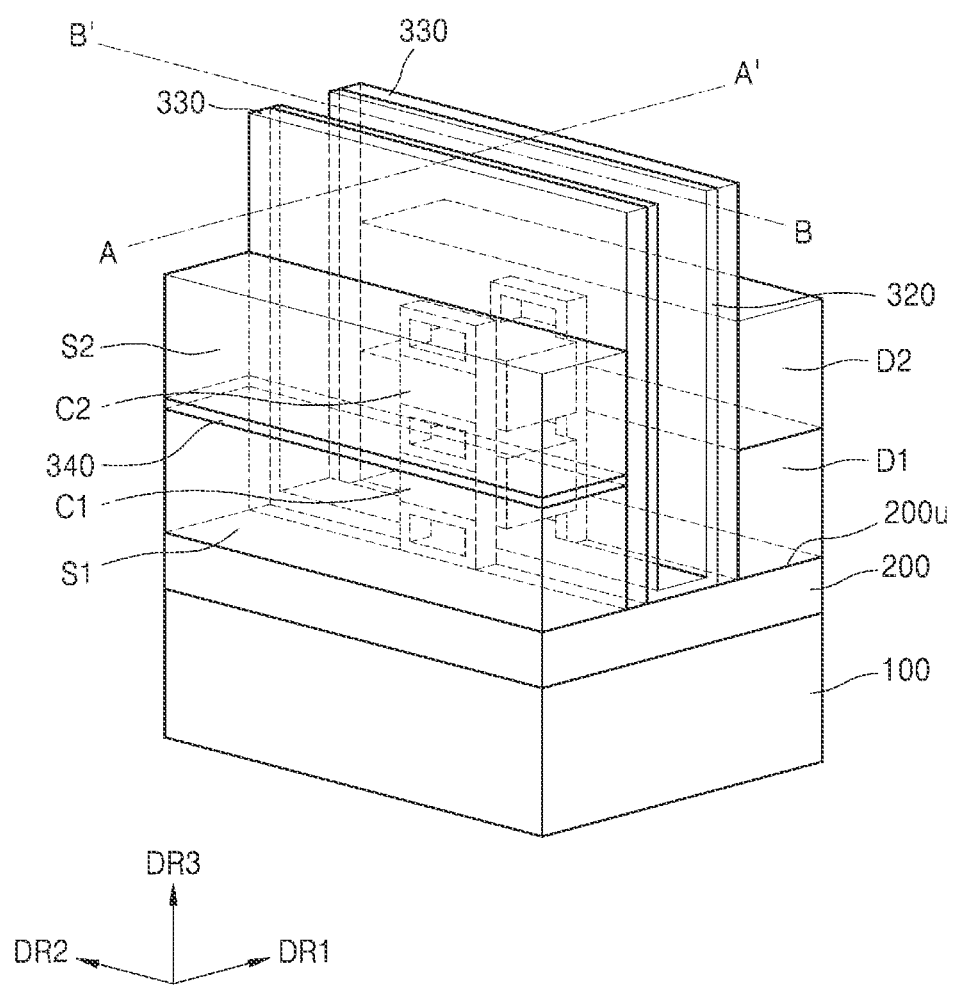
Figure 22:
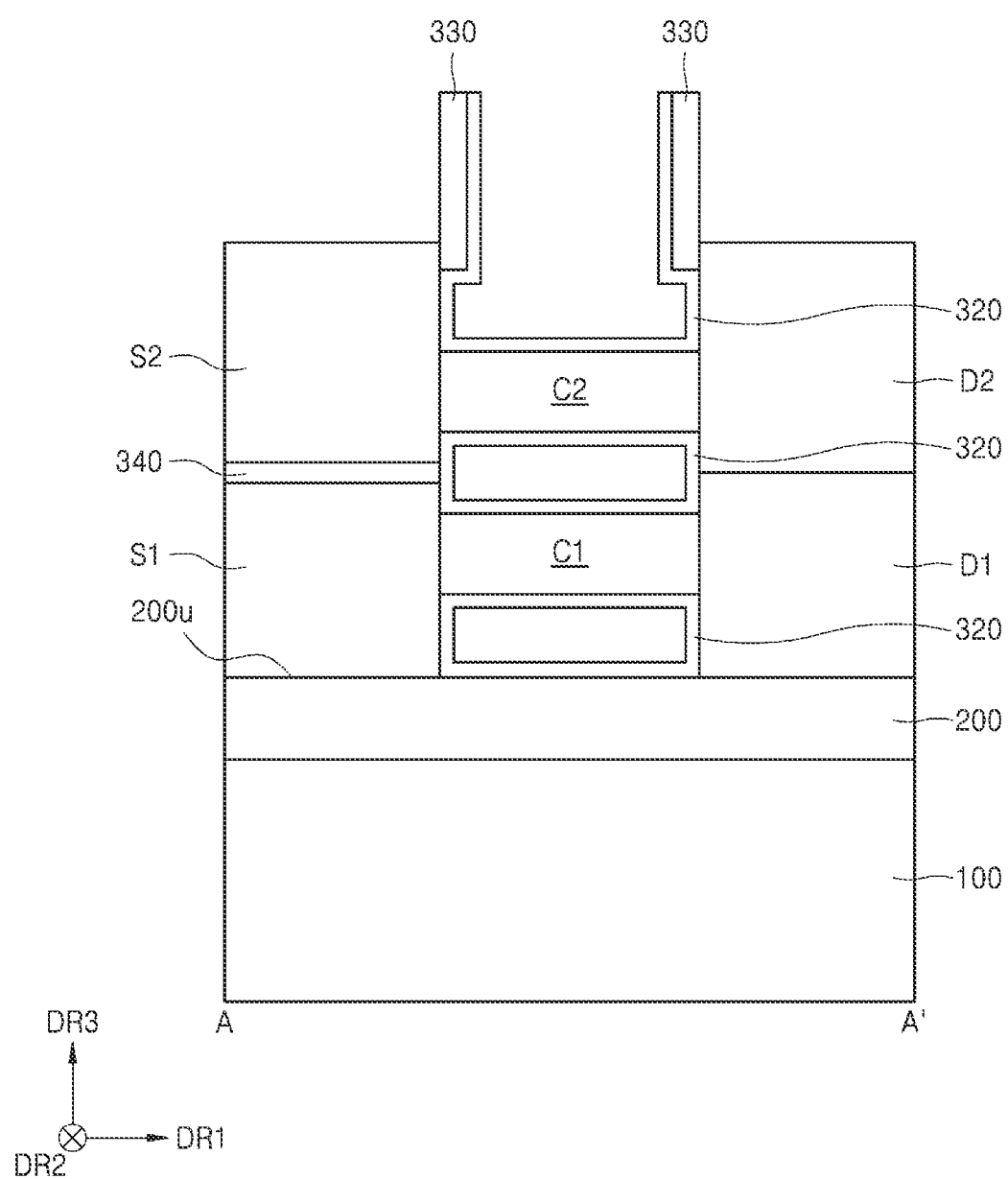
Figure 23:
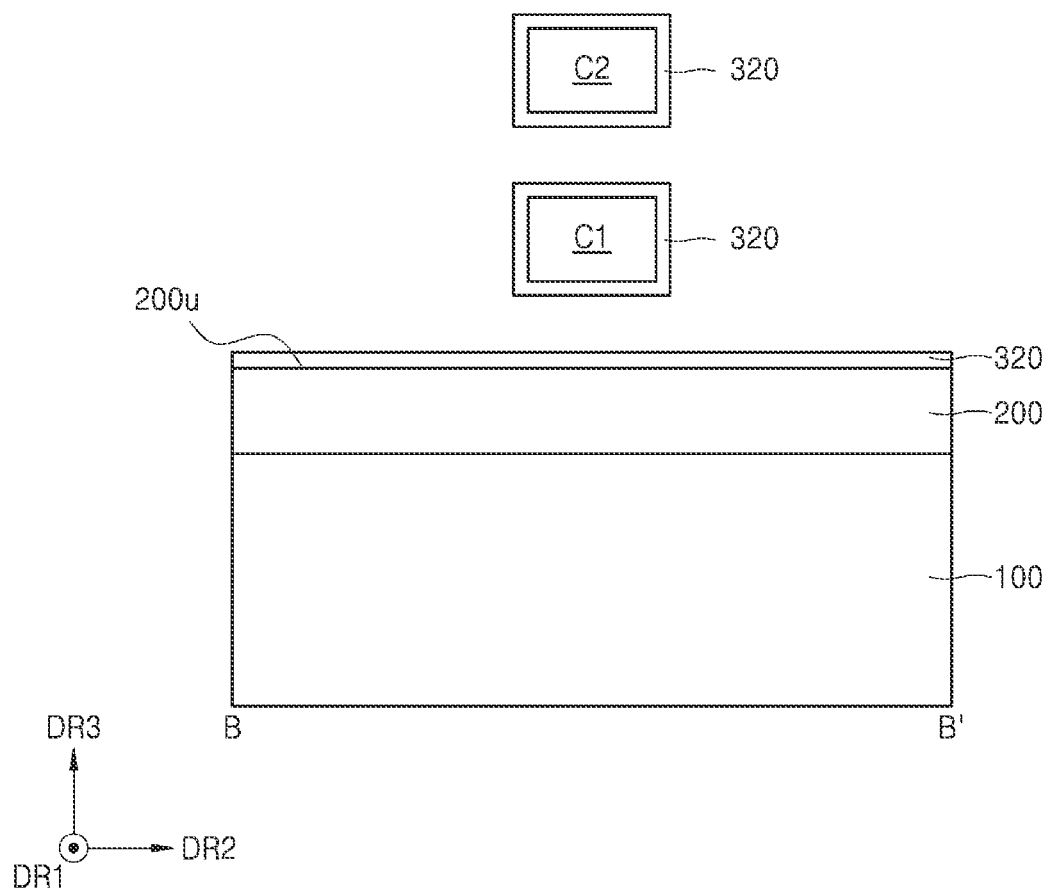

Next, as shown in FIGS. 21 to 23, the gate insulating film 320 is formed. A port in particular, the gate insulating film 320 is formed, wherein the gate insulating film 320 covers the outer surface of the first channel C1, the outer surface of the second channel C2, the part of the surface of the first source S1 in the direction to the first drain D1, the part other than a portion thereof in contact with the first channel C1, the part of the surface of the second source S2 in the direction to the second drain D2, the part other than a portion thereof in contact with the second channel C2, the part of the surface of the first drain D1 in the direction to the first source S1, the part other than a portion thereof in contact with the first channel C1, the part of the surface of the second drain D2 in the direction to the second source S2, the part other than a portion thereof in contact with the second channel C2, and the constant current forming layer 200.

An operation of forming the gate insulating film 320 may include depositing an electrical insulating material. For example, the depositing of the electrical insulating material may include performing a thermal oxidation, a chemical vapor deposition, a physical vapor deposition, or an atomic layer deposition.

The gate insulating film 320 formed in this way may include silicon oxide, silicon nitride, silicon oxynitride, or the like. Alternatively, the gate insulating film 320 may include an insulating material having a high-k dielectric constant. For example, the gate insulating film 320 may include a material having a dielectric constant of about 10 to about 25. For example, the gate insulating film 320 may include at least one material selected from HfO, HfSiO, HfON, HfSiON, LaO, LaAlO, ZrO, ZrSiO, ZrON, ZrSiON, TaO, TiO, BaSrTiO, BaTiO, SrTiO, YO, AlO, and PbScTaO.

Next, by forming the gate electrode G, the ternary inverter 10 described with reference to FIGS. 1 to 3 may be manufactured. The gate electrode G may be formed between the gate spacers 330. The gate electrode G may be formed by filling a space between the gate spacers 330 with a material for forming the gate electrode G. In particular, the gate electrode G may be formed by filling an area surrounded by the gate insulating film 320 with a conductive material. The gate electrode G may include an electrically conductive material. For example, the gate electrode G may include a metal or polysilicon. An operation of forming the gate electrode G may use a CVD operation, a PVD operation, or an ALD operation.

According to an embodiment of the present disclosure made as described above, a ternary inverter having a small area and high energy efficiency and an operating method of the ternary inverter may be implemented. However, the scope of the present disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A ternary inverter comprising:
   a first source and a first drain apart from each other;
   an interlayer insulating film on the first source;
   a second source on the interlayer insulating film and a second drain on the first drain;
   a first channel positioned between the first source and the first drain and having a $1^{st}$-$1^{st}$ end surface in a direction to the first source and a $1^{st}$-$2^{nd}$ end surface in a direction to the first drain, wherein the $1^{st}$-$1^{st}$ end surface is in contact with the first source, and the $1^{st}$-$2^{nd}$ end surface is in contact with the first drain;
   a second channel disposed over the first channel to be apart from the first channel, positioned between the second source and the second drain, and having a $2^{nd}$-$1^{st}$ end surface in a direction to the second source and a $2^{nd}$-$2^{nd}$ end surface in a direction to the second drain, wherein the $2^{nd}$-$1^{st}$ end surface is in contact with the second source, and the $2^{nd}$-$2^{nd}$ end surface is in contact with the second drain;
   a gate insulating film covering an outer surface of the first channel, an outer surface of the second channel, a part of a surface of the first source in the direction to the first drain, the part other than a portion thereof in contact with the first channel, a part of a surface of the second source in the direction to the second drain, the part other than a portion thereof in contact with the second channel, a part of a surface of the first drain in the direction to the first source, the part other than a portion thereof in contact with the first channel, and a part of a surface of the second drain in the direction to the second source, the part other than a portion thereof in contact with the second channel;
   a gate electrode between the first source and the first drain and between the second source and the second drain; and
   a constant current forming layer, wherein the first source and the first drain are disposed on the constant current forming layer.

2. The ternary inverter of claim 1, wherein the first source is doped with a conductivity type which is different from a conductivity type with which the second source is doped.

3. The ternary inverter of claim 2, wherein the first drain is doped with a conductivity type which is different from a conductivity type with which the first source is doped.

4. The ternary inverter of claim 2, wherein the first drain is doped with a conductivity type which is different from a conductivity type with which the second drain is doped.

5. The ternary inverter of claim 1, wherein the gate electrode fills a space between the first channel and the second channel.

6. The ternary inverter of claim 5, wherein the gate electrode surrounds a first portion of the gate insulating film, the first portion surrounding the first channel, and a second portion of the gate insulating film, the second portion surrounding the second channel.

7. A method of manufacturing a ternary inverter, the method comprising:
   forming a gate structure on a substrate, the gate structure extending in a first direction and including a first sacrificial layer, a first channel on the first sacrificial layer, a second sacrificial layer on the first channel, a second channel on the second sacrificial layer, and a third sacrificial layer on the second channel;

forming a dummy gate extending in a second direction intersecting the first direction such that the dummy gate crosses the gate structure;

forming a first source in contact with a $1^{st}$-$1^{st}$ end surface of the first channel on one side of the dummy gate and forming a first drain in contact with a $1^{st}$-$2^{nd}$ end surface of the first channel on the other side of the dummy gate;

forming an interlayer insulating film on the first source;

forming a second source in contact with a $2^{nd}$-$1^{st}$ surface of the second channel on the interlayer insulating film and forming a second drain in contact with a $2^{nd}$-$2^{nd}$ end surface of the second channel on the first drain;

removing the dummy gate;

removing the first sacrificial layer, the second sacrificial layer, and the third sacrificial layer;

forming a gate insulating film covering an outer surface of the first channel, an outer surface of the second channel, a part of a surface of the first source in a direction to the first drain, the part other than a portion thereof in contact with the first channel, a part of a surface of the second source in a direction to the second drain, the part other than a portion thereof in contact with the second channel, a part of a surface of the first drain in a direction to the first source, the part other than a portion thereof in contact with the first channel, and a part of a surface of the second drain in a direction to the second source, the part other than a portion thereof in contact with the second channel; and forming a gate electrode between the first source and the first drain and between the second source and the second drain; and forming a constant current forming layer, wherein the first source and the first drain are disposed on the constant current forming layer.

8. The method of claim 7, further comprising doping the first source and the first drain with different conductivity types.

9. The method of claim 8, further comprising doping the second source with a conductivity type different from that of the first source, and doping the second drain with a conductivity type different from that of the first drain.

10. The method of claim 7, wherein the forming of the gate electrode comprises forming the gate electrode to fill a space where the dummy gate is removed between the first source and the first drain and between the second source and the second drain.

11. The method of claim 7, wherein the forming of the gate electrode comprises forming the gate electrode to surround a first portion of the gate insulating film, the first portion surrounding the first channel, and a second portion of the gate insulating film, the second portion surrounding the second channel.

\* \* \* \* \*